United States Patent
Kim et al.

(10) Patent No.: US 12,074,079 B2
(45) Date of Patent: Aug. 27, 2024

(54) WIDE BANDGAP SEMICONDUCTOR DEVICE WITH SENSOR ELEMENT

(71) Applicant: Wolfspeed, Inc., Durham, NC (US)

(72) Inventors: Joohyung Kim, Cary, NC (US); Sei-Hyung Ryu, Cary, NC (US); Kijeong Han, Apex, NC (US); Thomas E. Harrington, III, Carrollton, TX (US); Edward Robert Van Brunt, Raleigh, NC (US)

(73) Assignee: Wolfspeed, Inc., Durham, NC (US)

( * ) Notice: Subject to any disclaimer, the term of this patent is extended or adjusted under 35 U.S.C. 154(b) by 807 days.

(21) Appl. No.: 17/201,468

(22) Filed: Mar. 15, 2021

(65) Prior Publication Data
US 2021/0202341 A1 Jul. 1, 2021

Related U.S. Application Data

(63) Continuation-in-part of application No. 16/381,629, filed on Apr. 11, 2019, now Pat. No. 11,164,813.

(51) Int. Cl.
*H01L 23/34* (2006.01)
*H01L 29/06* (2006.01)
*H01L 29/78* (2006.01)

(52) U.S. Cl.
CPC .......... *H01L 23/34* (2013.01); *H01L 29/0696* (2013.01); *H01L 29/7811* (2013.01); *H01L 2924/3025* (2013.01)

(58) Field of Classification Search
CPC ............... H01L 29/407; H01L 29/7813; H01L 29/1095; H01L 29/7811; H01L 29/7831;
(Continued)

(56) References Cited

U.S. PATENT DOCUMENTS 5,726,472 A 3/1998 Higashida
6,013,934 A 1/2000 Embree et al.
(Continued)

FOREIGN PATENT DOCUMENTS

DE 10155373 A1 5/2003
JP S62224074 A 10/1987
(Continued)

OTHER PUBLICATIONS

"Notice of Preliminary Rejection in Corresponding Patent Application No. 10-2021-7036418, mailed Dec. 15, 2022, 8 pages".
(Continued)

*Primary Examiner* — Jaehwan Oh
*Assistant Examiner* — John M Parker
(74) *Attorney, Agent, or Firm* — Myers Bigel, P.A.

(57) ABSTRACT

Shielding techniques are used to provide an embedded sensor element such as a temperature sensing element on a wide bandgap power semiconductor device. A semiconductor device may include a drift layer and an embedded sensor element. The drift layer may be a wide bandgap semiconductor material. A shielding structure is provided in the drift layer below the embedded sensor element. The embedded sensor element may be provided between contacts that are in electrical contact with the shielding well. The distance between the contacts may be minimized. A noise reduction well may be provided between the contacts to further isolate the embedded sensor element from parasitic signals.

25 Claims, 28 Drawing Sheets

(58) Field of Classification Search
CPC ............... H01L 29/732; H01L 29/0696; H01L 23/5226; H01L 23/34
See application file for complete search history.

(56) References Cited

U.S. PATENT DOCUMENTS

| | | | |
|---|---|---|---|
| 6,180,966 B1 * | 1/2001 | Kohno | ............... H01L 29/7397 257/378 |
| 7,537,970 B2 | 5/2009 | Robb et al. | |
| 9,324,800 B1 | 4/2016 | Ku et al. | |
| 2003/0136984 A1 | 7/2003 | Masuda et al. | |
| 2006/0091480 A1 | 5/2006 | Desko et al. | |
| 2006/0157779 A1 | 7/2006 | Kachi et al. | |
| 2007/0029573 A1 | 2/2007 | Cheng et al. | |
| 2008/0079079 A1 | 4/2008 | Noguchi et al. | |
| 2008/0290407 A1 | 11/2008 | Kusunoki et al. | |
| 2011/0062545 A1 | 3/2011 | Nakajima | |
| 2012/0267711 A1 | 10/2012 | Grebs et al. | |
| 2013/0187196 A1 | 7/2013 | Kadow | |
| 2013/0228854 A1 | 9/2013 | Dix et al. | |
| 2014/0001539 A1 | 1/2014 | Yagi et al. | |
| 2014/0217495 A1 | 8/2014 | Wutte et al. | |
| 2014/0246790 A1 | 9/2014 | Haney et al. | |
| 2014/0367770 A1 | 12/2014 | Aoki et al. | |
| 2014/0374818 A1 | 12/2014 | Jin | |
| 2015/0115315 A1 | 4/2015 | Tse et al. | |
| 2015/0115449 A1 | 4/2015 | Schaffer et al. | |
| 2017/0111037 A1 | 4/2017 | Shiigi et al. | |
| 2017/0200822 A1 | 7/2017 | Li et al. | |
| 2017/0221989 A1 | 8/2017 | Hirler et al. | |
| 2017/0287802 A1 | 10/2017 | Numabe et al. | |
| 2018/0183433 A1 | 6/2018 | Ojima et al. | |
| 2018/0233563 A1 | 8/2018 | Hiyoshi et al. | |
| 2018/0277437 A1 | 9/2018 | Yamada et al. | |
| 2018/0350900 A1 | 12/2018 | Nakamata et al. | |
| 2019/0131443 A1 | 5/2019 | Hoshi | |
| 2020/0026517 A1 | 1/2020 | Harrington, III et al. | |
| 2020/0328150 A1 | 10/2020 | Lichtenwalner et al. | |

FOREIGN PATENT DOCUMENTS

| | | |
|---|---|---|
| JP | H0252468 A | 2/1990 |
| JP | H08274321 A | 10/1996 |
| JP | 2004014707 A | 1/2004 |
| JP | 2012064899 A | 3/2012 |
| JP | 2012174726 A | 9/2012 |
| JP | 2013098316 A | 5/2013 |
| JP | 2014027076 A | 2/2014 |
| KR | 20120120072 A | 11/2012 |
| WO | 2014137622 A1 | 9/2014 |

OTHER PUBLICATIONS

Non-Final Office Action for U.S. Appl. No. 16/381,629, mailed Oct. 15, 2020, 12 pages.
Final Office Action for U.S. Appl. No. 16/381,629, mailed Apr. 15, 2021, 12 pages.
Notice of Allowance for U.S. Appl. No. 16/381,629, mailed Jul. 2, 2021, 9 pages.
International Search Report and Written Opinion for International Patent Application No. PCT/US2020/027153, mailed Jul. 21, 2020, 21 pages.
"International Search Report and Written Opinion for International Application No. PCTUS22017951, mailed Nov. 7, 2022, 14 pages".
"Japanese Office Action in Corresponding Patent Application No. 2021-559979, mailed Jan. 20, 2023, 12 pages".
"Translation of Japanese Office Action dated Aug. 9, 2023, issued in corresponding Japanese Application No. 2021-559979 (5 pages). ".
Shen, Z. John, et al., "Monolithic Integration of the Vertical IGBT and Intelligent Protection Circuits", 8th International Symposium on Power Semiconductor Devices and ICs. ISPSD'96. Proceedings, 1996, 295-298.
Invitation to Pay Additional Fees and Partial Search for International Patent Application No. PCT/US2022/017951, mailed Jun. 13, 2022, 14 pages.

* cited by examiner even pages may

WIDE BANDGAP SEMICONDUCTOR DEVICE WITH SENSOR ELEMENT

RELATED APPLICATIONS

This application is a continuation-in-part of U.S. patent application Ser. No. 16/381,629, filed Apr. 11, 2019, the disclosure of which is hereby incorporated herein by reference in its entirety.

FIELD OF THE DISCLOSURE

The present disclosure is related to semiconductor devices, and in particular to wide bandgap semiconductor devices including a sensor element.

BACKGROUND

Wide bandgap semiconductor devices are often used for power applications wherein the semiconductor device handles high voltages and/or currents. It is often desirable to monitor one or more operating conditions of these wide bandgap power semiconductor devices such as temperature, current, etc. in order to adjust one or more control signals provided thereto. For example, if the temperature of the device rises above a threshold, it may be desirable to adjust a switching speed of the device or turn off the device in order to avoid damaging the device. While embedded sensor elements that are monolithically integrated onto the die of the device are preferred, integrating sensor elements into wide bandgap power semiconductor devices presents several technical challenges that have yet to be overcome. Accordingly, current solutions rely on discrete sensor elements that are placed in close proximity to the semiconductor die they are measuring. This results in both reduced accuracy and increased area. Accordingly, there is a need for wide bandgap power semiconductor devices with one or more embedded sensor elements.

SUMMARY

In one embodiment, a semiconductor device includes a drift layer and an embedded sensor element. The drift layer comprises a wide bandgap semiconductor material. By including an embedded sensor element on a wide bandgap semiconductor device, accurate measurements of one or more operating parameters may be achieved in a compact solution.

In one embodiment, the embedded sensor element is a temperature sensing element such as a diode. The semiconductor device may further include an insulating layer between the embedded sensor element and the drift layer. To provide additional shielding, a shielding well having a doping type opposite the doping type of the drift layer may be provided below the embedded sensor element in the drift layer. The shielding well may provide additional isolation for the embedded sensor element from parasitic signals. Further, the embedded sensor element may be provided between a first contact and a second contact, both of which are in electrical contact with the shielding well and coupled to a fixed potential such as ground. Coupling the shielding well to a fixed potential may provide additional isolation for the embedded sensor element from parasitic signals. The first contact and the second contact may be electrically coupled to the shielding well via a first contact well and a second contact well, respectively, each of which has a same doping type as the shielding well and a higher doping concentration than the shielding well. A noise reduction well may further be provided in the shielding well. The noise reduction well may have a doping type that is opposite the doping type of the shielding well. The noise reduction well may reduce the resistance at the surface of the drift layer below the embedded sensor element, thereby providing additional isolation of the embedded sensor element from parasitic signals. The first contact and the second contact may also be in electrical contact with the noise reduction well. In yet another embodiment, a functional layer and an additional insulating layer are provided between the embedded sensor element and the drift layer. The functional layer and the additional insulating layer may provide additional isolation for the embedded sensor element from parasitic signals. A distance between the first contact well and the second contact well may be minimized in order to further improve isolation of the embedded sensor element from parasitic signals. In various embodiments, the distance between the first contact well and the second contact well is less than 200 µm, less than 100 µm, less than 50 µm, and less than 25 µm.

In one embodiment, a method for manufacturing a semiconductor device includes providing a drift layer and providing an embedded sensor element. The drift layer may comprise a wide bandgap semiconductor material. By including an embedded sensor element on a wide bandgap semiconductor device, accurate measurements of one or more operating parameters may be achieved in a compact solution.

In one embodiment, the embedded sensor element is a temperature sensing element such as a diode. The method may further include providing an insulating layer between the embedded sensor element and the drift layer. To provide additional shielding, a shielding well having a doping type opposite the doping type of the drift layer may be provided below the embedded sensor element in the drift layer. The shielding well may provide additional isolation for the embedded sensor element from parasitic signals. Further, the embedded sensor element may be provided between a first contact and a second contact, both of which are in electrical contact with the shielding well and coupled to a fixed potential such as ground. Coupling the shielding well to a fixed potential may provide additional isolation for the embedded sensor element from parasitic signals. The first contact and the second contact may be electrically coupled to the shielding well via a first contact well and a second contact well, respectively, each of which has a same doping type as the shielding well and a higher doping concentration than the shielding well. A noise reduction well may further be provided in the shielding well. The noise reduction well may have a doping type that is opposite the doping type of the shielding well. The noise reduction well may reduce the resistance at the surface of the drift layer below the embedded sensor element, thereby providing additional isolation of the embedded sensor element from parasitic signals. The first contact and the second contact may also be in electrical contact with the noise reduction well. In yet another embodiment, a functional layer and an additional insulating layer are provided between the embedded sensor element and the drift layer. The functional layer and the additional insulating layer may provide additional isolation for the embedded sensor element from parasitic signals. A distance between the first contact well and the second contact well may be minimized in order to further improve isolation of the embedded sensor element from parasitic signals. In various embodiments, the distance between the first contact well and the second contact well is less than 200 µm, less than 100 µm, less than 50 µm, and less than 25 µm.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
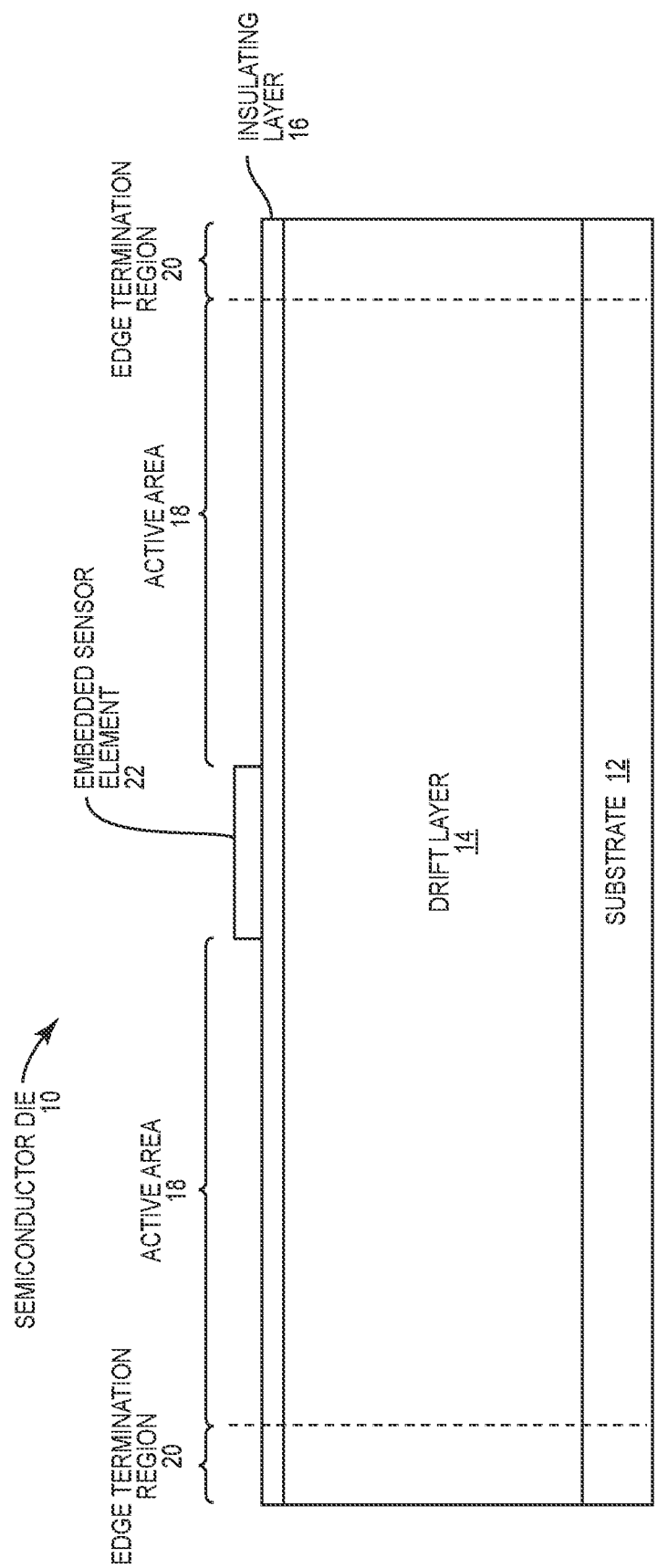
FIG. 1 is a cross-sectional view of a semiconductor die according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates a cross-sectional view of a semiconductor die 10 according to one embodiment of the present disclosure. The semiconductor die 10 includes a substrate 12, a drift layer 14 on the substrate 12, and an insulating layer 16 on the drift layer 14. The semiconductor die 10 includes an active area 18 in which one or more implanted regions are provided to form a functional semiconductor device and an edge termination region 20 surrounding the active area 18. Somewhere within the edge termination region 20, an embedded sensor element 22 is provided. In some embodiments, the embedded sensor element 22 is on the insulating layer 16 such that the insulating layer 16 is between the embedded sensor element 22 and the drift layer 14.

As discussed above, one or more implanted regions are provided in the active area 18 to form a functional semiconductor device. In one embodiment, the functional semiconductor device is a switching power semiconductor device. For example, the functional semiconductor device may be a metal-oxide-semiconductor field-effect transistor (MOSFET), and in particular a vertical MOSFET, a bipolar junction transistor (BJT), an insulated gate bipolar transistor (IGBT), a junction field-effect transistor (JFET), a gate-controlled thyristor (GTO), or the like. Further, the functional semiconductor device may be in any suitable topology such as planar, vertical, and trench devices. Accordingly, the substrate 12 and/or the drift layer 14 may comprise a wide bandgap material such as silicon carbide, gallium nitride, gallium oxide, and zinc oxide, as these materials may be beneficial in devices intended to handle high voltages and/or currents. As discussed above, integrated sensor elements into wide bandgap power semiconductor devices presents several technical challenges. In particular, wide bandgap materials have a significantly higher sheet resistance than their narrow bandgap counterparts. This high resistance, coupled with the high voltages and currents handled by power devices, results in large parasitic signals that interfere with the operation of embedded sensor elements. Whereas for narrow bandgap semiconductor devices such as silicon devices, sensor elements can be integrated directly into the drift layer in many cases or otherwise provided with minimal shielding from parasitic signals, these same devices would not be functional if embedded in a wide bandgap power semiconductor device.

Another obstacle to implementing embedded sensor elements in wide bandgap power semiconductor devices is cost. While fabrication for narrow bandgap power semiconductor devices such as silicon devices is cheap and extra process steps add little extra cost, each extra processing step for wide bandgap power semiconductor devices adds significant cost. It is therefore desirable to implement an embedded sensor element using as few additional manufacturing steps as possible.

As defined herein, a power semiconductor device is a semiconductor device having an avalanche breakdown voltage greater than or equal to 50 V. As discussed above, the high voltages and currents handled by these devices may create parasitic signals that present challenges to the implementation of embedded sensor elements. The relatively high sheet resistance of wide bandgap semiconductor materials further complicates the implementation of embedded sensor elements.

One way to isolate the embedded sensor element 22 is to provide the insulating layer 16 between the embedded sensor element 22 and the drift layer 14. In one embodiment, the insulating layer 14 is an oxide layer such as a field oxide layer. For example, the insulating layer 14 may comprise one or more layers of $Al_2O_3$ and $SiO_2$ separately or in an alternating fashion and/or one or more layers of $Si_3N_4$ and $SiO_2$ separately or in an alternating fashion. The insulating layer 14 may thus be one that is already present on the semiconductor die 10. For example, the insulating layer 14 may form a gate oxide in some areas of the semiconductor die 10 and a field oxide in other areas of the semiconductor die 10. Accordingly, the insulating layer 14 is already available with no additional manufacturing steps. Additionally, the embedded sensor element 22 may be provided in a polysilicon layer that is already present to create the functional semiconductor device on the semiconductor die 10. For example, the polysilicon layer may form a gate electrode and/or gate contact in some parts of the semiconductor die 10. Accordingly, the layer used to provide the embedded sensor element 22 is already available with no additional manufacturing steps, apart from reworking the mask used to deposit the layer. To create the functionality of the embedded sensor element 22, one or more implants may be necessary in the portion of the polysilicon layer that provides the embedded sensor element 22 (e.g., to create a diode, a lumped resistor, or the like), the details of which are discussed below. These extra manufacturing steps are the smallest number necessary for providing the embedded sensor element 22, thereby minimizing the cost of the embedded sensor element 22.

The polysilicon layer used to provide the gate electrode and/or contact and the sensor element 22 may be a doped polysilicon layer that is provided via any suitable process. In some embodiments, the polysilicon layer is provided via an epitaxial growth process in which dopants are provided in the atmosphere in order to create a desired doping profile. In other embodiments, the polysilicon layer may be deposited and then doped as desired via an implantation process. As discussed above, ion implantation may be the preferred approach when providing the sensor element 22 since it may require separately doped areas to provide a diode or other sensing device. Ion implantation may provide other benefits as well, such as improving the uniformity of sheet resistance of the polysilicon layer by 5-10% in some embodiments and 10-20% in other embodiments. This is due to the use of heavy dopant ions such as boron-diflouride (BF2), which may break up the crystalline structure of the polysilicon layer into smaller crystal sizes.

Figure 2:
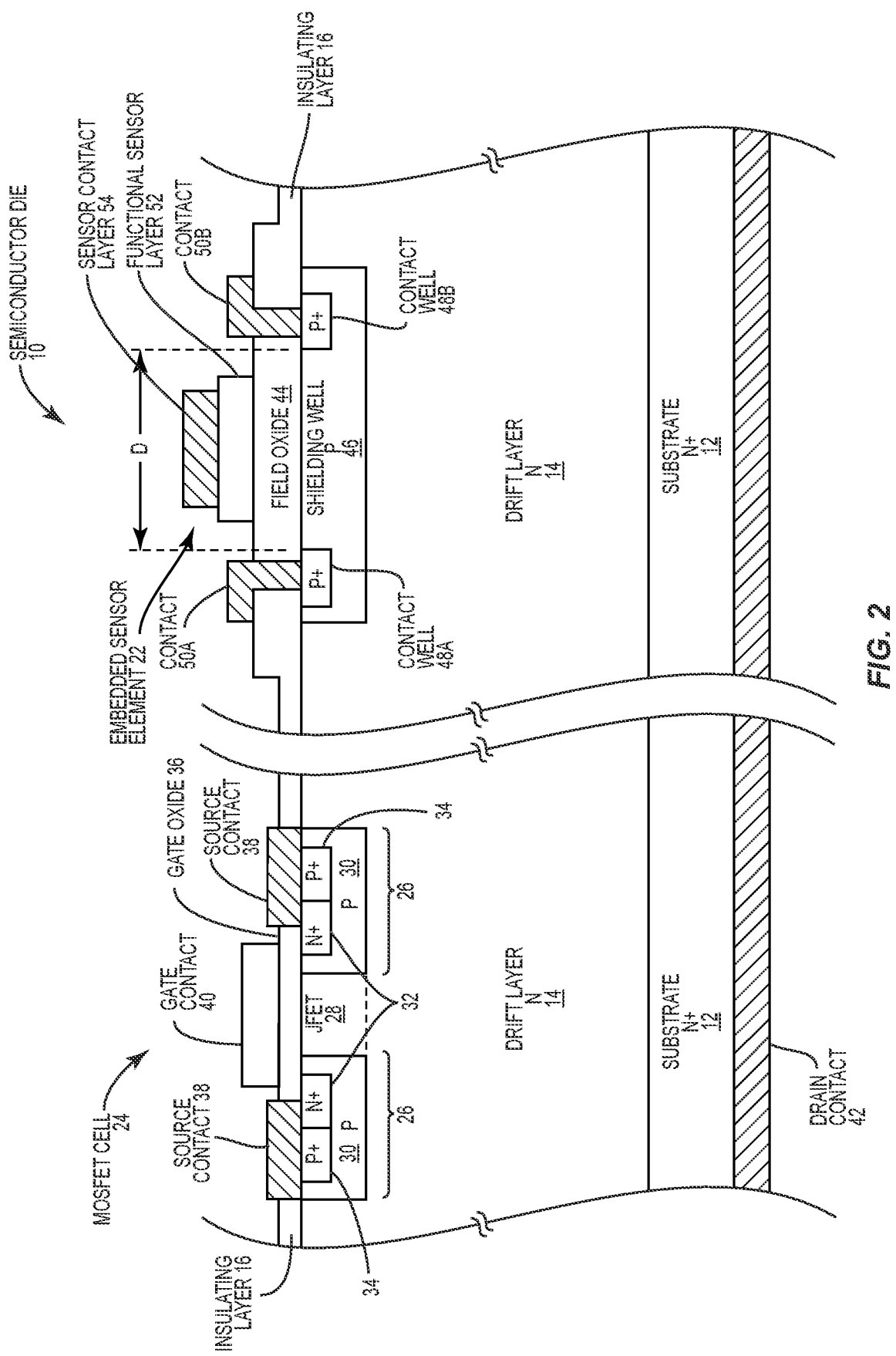
FIG. 2 is a cross-sectional view of a semiconductor die according to one embodiment of the present disclosure.

While the insulating layer 16 may provide some amount of isolation for the embedded sensor element 22, more isolation may be desirable in some scenarios. Accordingly, FIG. 2 illustrates a cross-sectional view of the semiconductor die 10 showing additional details of the embedded sensor element 22. For illustration, a MOSFET cell 24 is shown adjacent to the embedded sensor element 22. However, as discussed above this is only illustrative and any number of functional semiconductor devices such as BJTs, IGBTs, and thyristors could be provided instead of or in addition to the MOSFET cell 24.

The MOSFET cell 24 includes a pair of junction implants 26 separated by a junction field-effect transistor (JFET) region 28. Each one of the junction implants 26 includes deep well region 30, a source region 32, and a body region 34. A gate oxide 36, which is part of the insulating layer 16, is on the drift layer 14 over a portion of each one of the junction implants 26 and the JFET region 28 as shown. A source contact 38 is also on the drift layer 14 over a portion of each one of the junction implants 26 as shown. A gate contact 40 is on the gate oxide 36. A drain contact 42 is on the substrate 12 opposite the drift layer 14. As shown, the MOSFET cell 24 is an n-type device, where the substrate 12, the drift layer 14, the deep well regions 30, the source regions 32, the body regions 34, and the JFET region 28 are labeled with their doping types and relative doping concentrations to one another (with a "+" indicating a higher doping level with respect to other regions). However, the principles of the present disclosure apply equally to p-type devices in which all of the doping types shown are reversed. Those skilled in the art will recognize the MOSFET cell 24 as a vertical MOSFET, and specifically a double-diffused MOSFET (DMOS). Further, those skilled in the art will appreciate that the MOSFET cell 24 is only one of many cells that are provided throughout the active area 18 and interconnected to provide a MOSFET with a number of desired characteristics such as a desired on-state resistance and a desired blocking voltage. While the examples described throughout the present application show the MOSFET cell 24 along with the details of the embedded sensor element 22, the embedded sensor element 22 could also be provided alongside a BJT cell, an IGBT cell, a JFET cell, a GTO cell, or the like. Further, the embedded sensor element 22 could also be provided alongside a planar device or a trench device, rather than a vertical device as shown.

Turning to the details of the embedded sensor element 22, the embedded sensor element 22 may comprise one or more layers on a field oxide 44, which is part of the insulating layer 16 on the drift layer 14. In particular, the embedded sensor element 22 may comprise a functional sensor layer 52 and a sensor contact layer 54. Notably, the functional sensor layer 52 is a portion of a polysilicon layer which is also used to provide the gate contact 40. In other words, the gate contact 40 and the functional sensor layer 52 are formed from the same layer (patterned, for example, using a mask). As discussed above, this saves a manufacturing step and thus allows for the implementation of the embedded sensor element 22 with minimal additional cost. As shown in FIG. 2, the field oxide 44 is much thicker than the gate oxide 36 due to their different functions. While the gate oxide 36 acts as a dielectric to provide a gate capacitance, the field oxide 44 is used to provide electrical isolation and shielding for various parts of the semiconductor die 10.

Underneath the embedded sensor element 22 in the drift layer 14, a shielding well 46 is provided. While the drift layer 14 is an n-type layer, the shielding well 46 is a p-type region. More generically, the shielding well 46 has a doping type that is opposite the doping type of the drift layer 14. The shielding well 46 may be an implanted region in the drift layer 14 in some embodiments, but in general may be provided by any suitable means. The shielding well 46 forms a P-N junction with the drift layer 14 such that the shielding well blocks DC voltages at the surface of the drift layer 14 underneath the embedded sensor element 22. In the shielding well 46, a first contact well 48A and a second contact well 48B are provided. The first contact well 48A and the second contact well 48B are p-type regions that have a higher doping concentration than the shielding well 46. The first contact well 48A and the second contact well 48B may be implanted regions in the drift layer 14, but may also be provided by any suitable means. The contact wells 48 provide an ohmic connection to the shielding well 46 for a first contact 50A and a second contact 50B such that the first contact 50A and the second contact 50B are electrically coupled to the shielding well 46 via the first contact well 48A and the second contact well 48B, respectively. To further shield the embedded sensor element 22 from parasitic voltages and currents, the first contact 50A and the second contact 50B are coupled to a fixed potential such as ground. In other embodiments, the first contact 50A and the second contact 50B may be coupled to the source contacts 38 of the MOSFET cell 24 or otherwise connected to a particular portion of a functional semiconductor device on the semiconductor die 10. Coupling the first contact 50A and the second contact 50B to a fixed potential or a particular portion of a functional semiconductor device on the semiconductor die 10 may reduce parasitic currents in the shielding well 46 due to transient signals (e.g., AC signals) in the drift layer 14. This is important because the shielding well 46 has a finite resistance, and thus any parasitic currents in the shielding well 46 will generate a voltage at the surface of the drift layer 14 below the embedded sensor element 22. These voltages may be capacitively coupled into the embedded sensor element 22 via the field oxide 44, which will interfere with the operation thereof. In various embodiments, the first contact 50A and the second contact 50B, as well as the source contact 38 and the drain contact 42 may comprise any suitable ohmic metal such as aluminum, titanium, and titanium nitride. While not shown, a metal contact layer may also be coupled to the gate contact 40 to form a gate contact pad. This additional metal contact layer may also comprise any suitable ohmic metal such as aluminum, titanium, and titanium nitride.

Those skilled in the art will appreciate that wide bandgap semiconductor materials have significantly higher resistances than their narrow bandgap counterparts. While this is generally beneficial for power devices because it allows them to support higher voltages without breaking down, it presents unique technical challenges for implementing embedded sensors due to the propensity to generate large parasitic signals that interfere with the operation thereof. As shown in FIG. 2, there is a distance D between the first contact well 48A and the second contact well 48B. The embedded sensor element 22 is provided between the first contact well 48A and the second contact well 48B within this distance D. It is desirable to minimize the distance D between the first contact well 48A and the second contact well 48B in order to minimize the resistance across the area of the shielding well 46 and thus reduce parasitic currents, which, as discussed above may otherwise induce voltages that interfere with the operation of the embedded sensor element 22. The resistance of the shielding well 46 at the midpoint between the first contact well 48A and the second contact well 48B is proportional to the distance D between the first contact well 48A and the second contact well 48B. By minimizing the distance D, the resistance can also be minimized. In one embodiment, the distance D between the first contact well 48A and the second contact well 48B is less than 200 µm. In other embodiments, the distance D between the first contact well 48A and the second contact well 48B is less than 100 µm, less than 50 µm, less than 25 µm, and as low as 5 µm. The smaller the distance between the first contact well 48A and the second contact well 48B, the lower the resistance through the shielding well 46. This results in lower interference in the embedded sensor element 22 due to the reduction in parasitic voltages within the shielding well 46.

Minimizing the distance D between the first contact well 48A and the second contact well 48B means that the embedded sensor element 22 will generally be provided as a long, thin strip extending into and/or out of the page as shown in FIG. 2. The embedded sensor element 22 may be any type of sensing element such as a diode, a resistor, or the like, which may provide a voltage and/or current that is proportional to a measurement of interest. For example, a diode may be provided by implanting an n-type region and/or a p-type region in the functional sensor layer 52, which as discussed above is the same polysilicon layer used for the gate contact 40. In some embodiments the polysilicon layer may already be doped in one way or another (e.g., as a p-type layer) and therefore only one implant is required (e.g., implantation to form the n-type region). The diode may provide a forward voltage drop that is proportional to temperature, thereby allowing external sensing circuitry to measure the temperature of the semiconductor die 10. Exemplary details of the embedded sensor element 22 are provided below.

Figure 3:
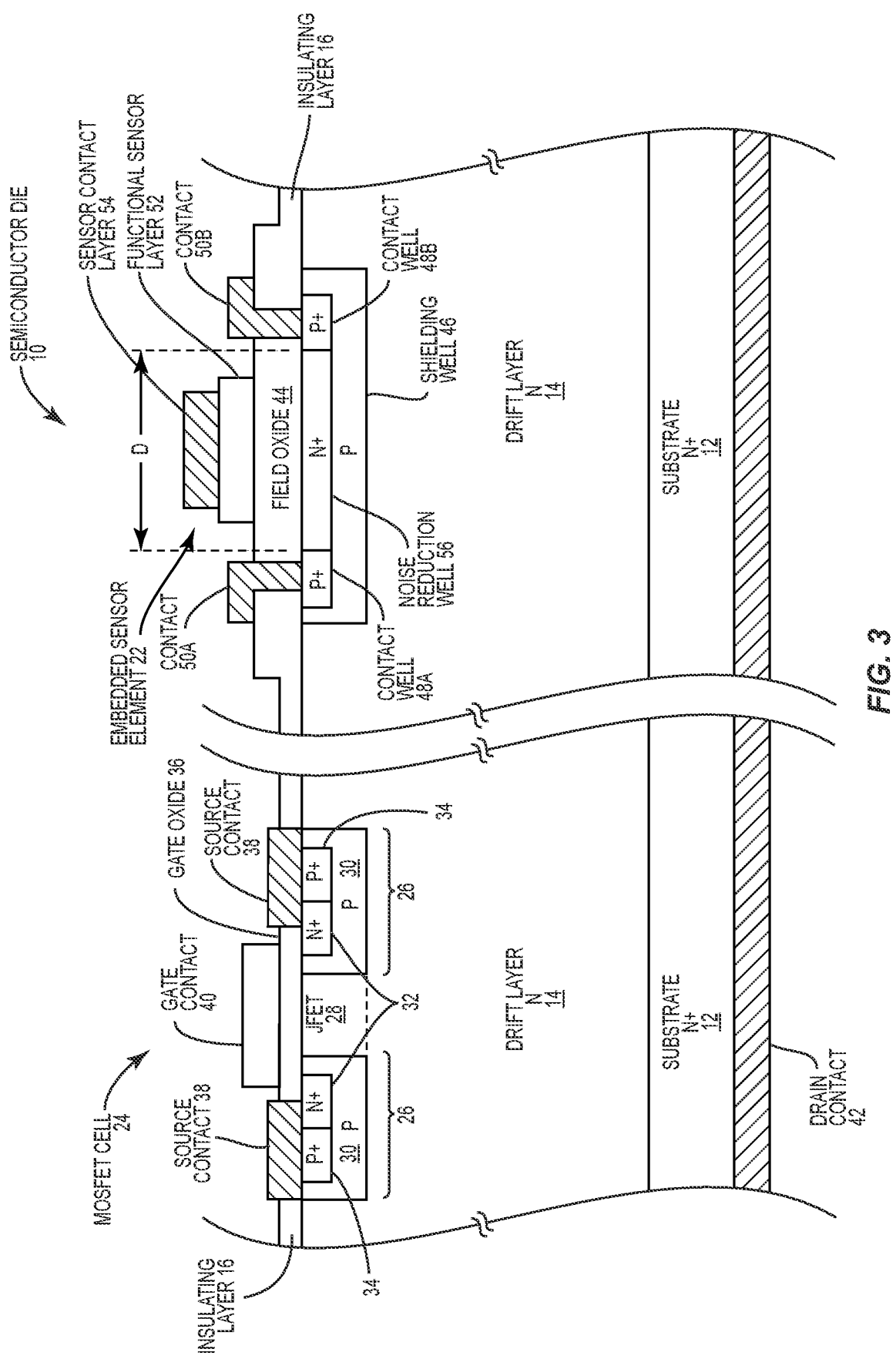
FIG. 3 is a cross-sectional view of a semiconductor die according to one embodiment of the present disclosure.

To further reduce the parasitic signals coupled into the embedded sensor element 22, a noise reduction well 56 may be provided in the shielding well 46, as shown in FIG. 3. The noise reduction well 56 has an opposite doping type to the shielding well 46 and is in electrical contact with the first contact 50A and the second contact 50B via the first contact well 48A and the second contact well 48B, respectively. In the example shown in FIG. 3, the noise reduction well 56 is an n-type region. The noise reduction well 56 may be an implanted region in the drift layer 14 but may also be provided by any suitable means. Those skilled in the art will appreciate that n-type wide bandgap semiconductor materials often have a resistance that is up to three orders of magnitude lower than their p-type counterparts. By providing the noise reduction well 56, the resistance at the surface of the drift layer 14 below the embedded sensor element 22 can be further reduced, which in turn may reduce parasitic signals that are coupled into the embedded sensor element 22.

Figure 4:
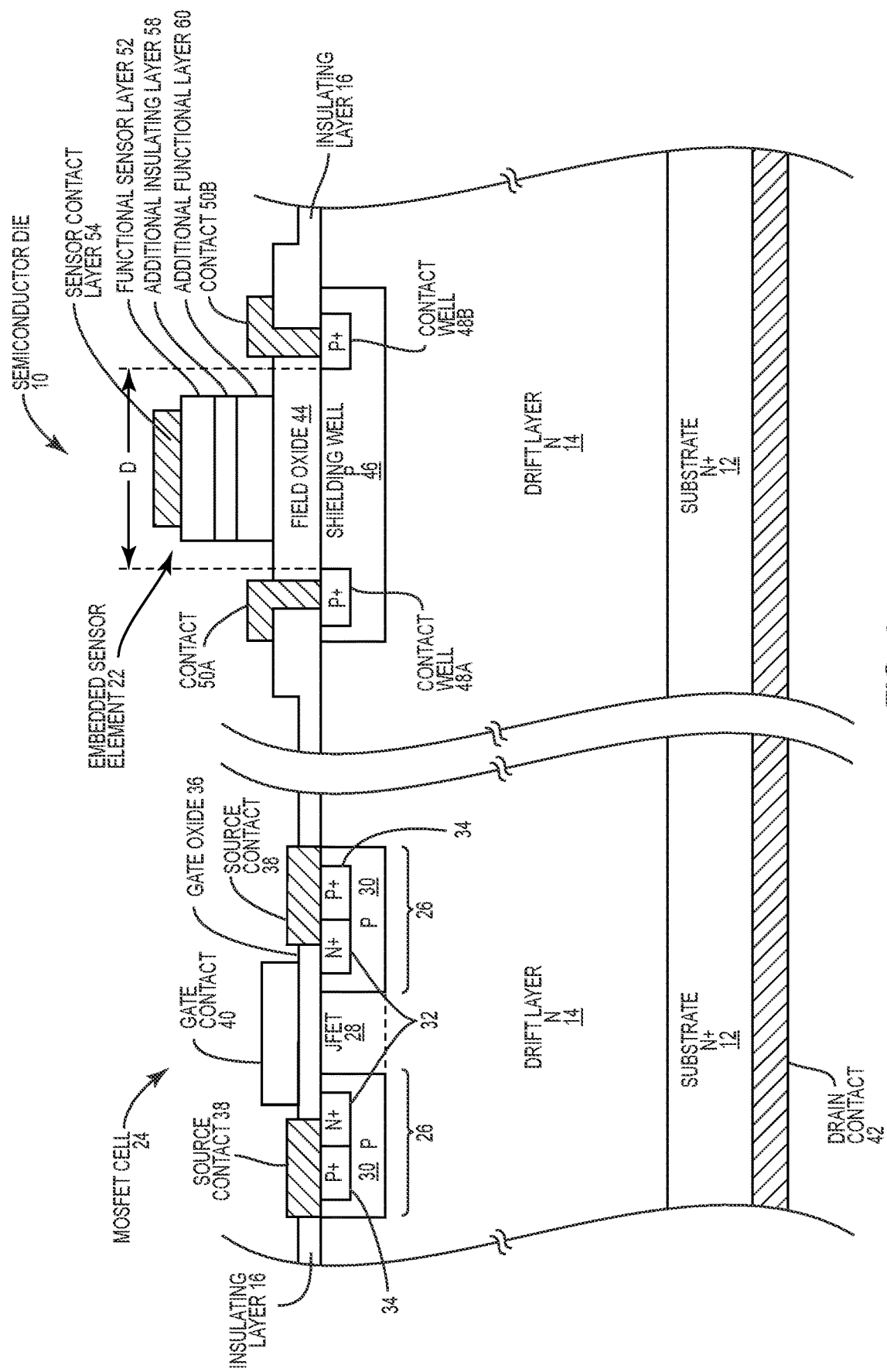
FIG. 4 is a cross-sectional view of a semiconductor die according to one embodiment of the present disclosure.

As discussed above, the functional sensor layer 52 is part of a polysilicon layer that also provides the gate contact 40. While this may save a manufacturing step, it also may prevent the layer from being metallized or silicided, as doing so would not allow the functional sensor layer 52 to provide a sensing element, since metallization or silicidation are generally blanket processes that affect the entire polysilicon layer. Metallization or silicidation of the polysilicon layer that provides the gate contact may be desirable, as it may decrease resistance and thus improve distribution of gate signals throughout the semiconductor die 10 to improve switching speed and other performance characteristics. Further, even with the shielding well 46 and the noise reduction well 56, further isolation between the embedded sensor element 22 and the drift layer 14 may be desired. Accordingly, FIG. 4 shows the embedded sensor element 22 with additional isolation according to one embodiment of the present disclosure. The semiconductor die 10 shown in FIG. 4 is substantially the same as that shown in FIG. 2, except that there is an additional insulating layer 58 and an additional functional layer 60 between the embedded sensor element 22 and the drift layer 14. In this embodiment, the functional sensor layer 52 is not part of the same layer used to form the gate contact 40, but rather is a "second-level" polysilicon layer that is in addition to the one used to form the gate contact 40. The additional functional layer 60 as shown in FIG. 4 is part the same layer used to form the gate contact 40, which may be a polysilicon layer in various embodiments as discussed above. Two additional layers, the additional insulating layer 58 and the functional sensor layer 52 are provided over the additional functional layer 60 to provide the embedded sensor element 22 such that the insulating layer 16, the additional functional layer 60, and the additional insulating layer 58 are between the embedded sensor element 22 and the drift layer 14. The additional two layers provide increased shielding of the embedded sensor element 22 while adding only two additional necessary layers. The additional insulating layer 58 may comprise any suitable insulating material such as $SiO_2$. The functional sensor layer 52 may be a second-level polysilicon layer, which is provided in a similar manner to the first polysilicon layer providing the gate contact 40 and the additional functional layer 60 as described above. While the second-level polysilicon layer adds additional manufacturing steps to create the semiconductor die 10, it may provide advantages such as enabling the first polysilicon layer to be metallized or silicided, which, as discussed above, can improve the performance of the semiconductor die 10.

Figure 5:
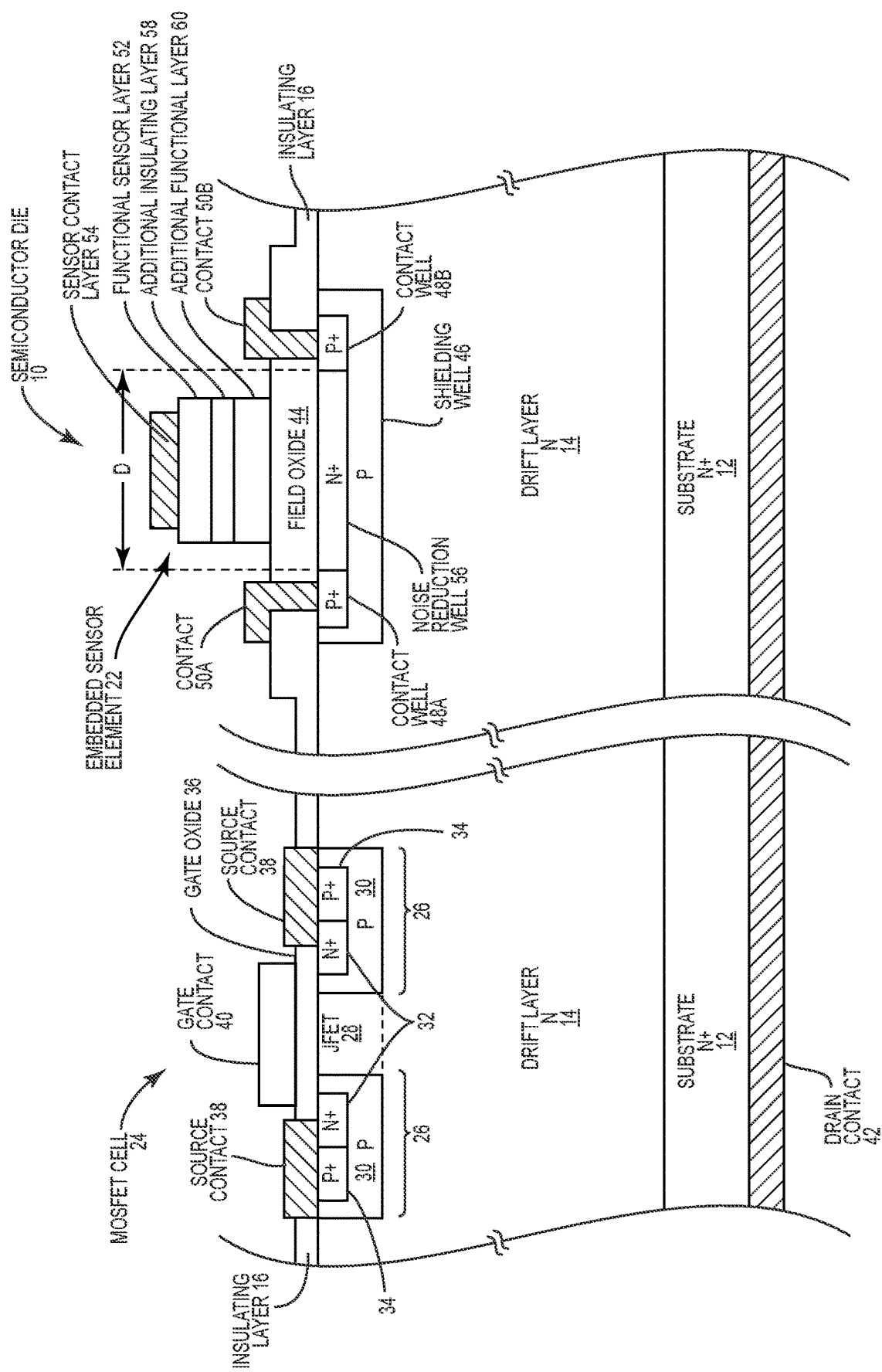
FIG. 5 is a cross-sectional view of a semiconductor die according to one embodiment of the present disclosure.

To provide even more shielding, the noise reduction well 56 may be added to the semiconductor die 10 shown in FIG. 4. Such an embodiment is shown in FIG. 5. As discussed above, the noise reduction well 56 may further decrease parasitic voltages at the surface of the drift layer 14 below the embedded sensor element 22 by decreasing the resistance in this area. Accordingly, interference with the embedded sensor element 22 can be even further decreased. While not shown in FIG. 4 or 5, in embodiments in which the additional functional layer 60 is partially or completely metallized and/or silicided, the contacts 50 may be electrically coupled to the additional functional layer 60. This may provide additional isolation for the embedded sensor element 22.

In the embodiments discussed above, the substrate 12 may be an n-type layer with a thickness between 0.2 μm and 10.0 μm and a doping concentration between $1\times10^{17}$ cm$^{-3}$ and $5\times10^{21}$ cm$^{-3}$. The drift layer 14 may be an n-type layer with a thickness between 1.0 μm and 20.0 μm and a doping concentration between $1\times10^{15}$ cm$^{-3}$ and $1\times10^{17}$ cm$^{-3}$. The shielding well 46 may be a p-type region with a thickness between 0.1 μm and 3.0 μm and a doping concentration between $1\times10^{17}$ cm$^{-3}$ and $5\times10^{21}$ cm$^{-3}$. In various embodiments, the thickness of the shielding well 46 may be provided in any subrange between 0.1 μm and 3.0 μm, or at any discrete point within the range. For example, the thickness of the shielding well 46 may be between 0.1 μm and 2.5 μm, between 0.1 μm and 2.0 μm, between 0.1 μm and 1.5 μm, between 0.1 μm and 1.0 μm, between 0.1 and 0.5 μm, between 0.5 and 3.0 μm, between 1.0 μm and 3.0 μm, between 1.5 μm and 3.0 μm, between 2.0 μm and 3.0 μm, between 2.5 μm and 3.0 μm, between 0.5 μm and 2.5 μm, between 1.0 μm and 2.0 μm, between 1.5 μm and 2.0 μm, and the like. Further, the doping concentration of the shielding well 46 may be provided in any subrange between $1\times10^{17}$ cm$^{-3}$ and $5\times10^{21}$ cm$^{-3}$, or at any discrete point within the range. For example, the doping concentration of the shielding well 46 may be between $5\times10^{17}$ cm$^{-3}$ and $5\times10^{21}$ cm$^{-3}$, between $1\times10^{18}$ cm$^{-3}$ and $5\times10^{21}$ cm$^{-3}$, between $5\times10^{18}$ cm$^{-3}$ and $5\times10^{21}$ cm$^{-3}$, between $1\times10^{19}$ cm$^{-3}$ and $5\times10^{21}$ cm$^{-3}$, between $5\times10^{19}$ cm$^{-3}$ and $5\times10^{21}$ cm$^{-3}$, between $1\times10^{20}$ cm$^{-3}$ and $5\times10^{21}$ cm$^{-3}$, between $5\times10^{20}$ cm$^{-3}$ and $5\times10^{21}$ cm$^{-3}$, between $1\times10^{21}$ cm$^{-3}$ and $5\times10^{21}$ cm$^{-3}$, between $1\times10^{17}$ cm$^{-3}$ and $1\times10^{21}$ cm$^{-3}$, between $1\times10^{17}$ cm$^{-3}$ and $5\times10^{20}$ cm$^{-3}$, between $1\times10^{17}$ cm$^{-3}$ and $1\times10^{20}$ cm$^{-3}$, between $1\times10^{17}$ cm$^{-3}$ and $5\times10^{19}$ cm$^{-3}$, between $1\times10^{17}$ cm$^{-3}$ and $1\times10^{19}$ cm$^{-3}$, between $1\times10^{17}$ cm$^{-3}$ and $5\times10^{18}$ cm$^{-3}$, between $1\times10^{17}$ cm$^{-3}$ and $1\times10^{18}$ cm$^{-3}$, between $1\times10^{17}$ cm$^{-3}$ and $5\times10^{17}$ cm$^{-3}$, between $5\times10^{17}$ cm$^{-3}$ and $1\times10^{21}$ cm$^{-3}$, between $1\times10^{18}$ cm$^{-3}$ and $5\times10^{20}$ cm$^{-3}$, between $5\times10^{18}$ cm$^{-3}$ and $1\times10^{20}$ cm$^{-3}$, and between $1\times10^{19}$ cm$^{-3}$ and $5\times10^{19}$ cm$^{-3}$. Each one of the contact wells 48 may be a p-type region with a thickness between 0.1 μm and 2.5 μm and a doping concentration between $1\times10^{17}$ cm$^{-3}$ and $5\times10^{21}$ cm$^{-3}$. In various embodiments, the thickness of the contact wells 48 may be provided within any subrange between 0.1 μm and 2.5 μm, or at any discrete point in the range. For example, the thickness of the contact wells 48 may be between 0.5 μm and 2.5 μm, between 1.0 μm and 2.5 μm, between 1.5 μm and 2.5 μm, between 2.0 μm and 2.5 μm, between 0.1 μm and 2.0 μm, between 0.1 μm and 1.5 μm, between 0.1 μm and 1.0 μm, between 0.1 μm and 0.5 μm, between 0.5 μm and 2.0 μm, and between 1.0 μm and 1.5 μm. Further, the doping concentration of the contact wells 48 may be provided in any subrange between $1\times10^{17}$ cm$^{-3}$ and $5\times10^{21}$ cm$^{-3}$, or at any discrete point within the range. For example, the doping concentration of the contact wells 48 may be between $5\times10^{17}$ cm$^{-3}$ and $5\times10^{21}$ cm$^{-3}$, between $1\times10^{18}$ cm$^{-3}$ and $5\times10^{21}$ cm$^{-3}$, between $5\times10^{18}$ cm$^{-3}$ and $5\times10^{21}$ cm$^{-3}$, between $1\times10^{19}$ cm$^{-3}$ and $5\times10^{21}$ cm$^{-3}$, between $5\times10^{19}$ cm$^{-3}$ and $5\times10^{21}$ cm$^{-3}$, between $1\times10^{20}$ cm$^{-3}$ and $5\times10^{21}$ cm$^{-3}$, between $5\times10^{20}$ cm$^{-3}$ and $5\times10^{21}$ cm$^{-3}$, between $1\times10^{21}$ cm$^{-3}$ and $5\times10^{21}$ cm$^{-3}$, between $1\times10^{17}$ cm$^{-3}$ and $1\times10^{21}$ cm$^{-3}$, between $1\times10^{17}$ cm$^{-3}$ and $5\times10^{20}$ cm$^{-3}$, between $1\times10^{17}$ cm$^{-3}$ and $1\times10^{20}$ cm$^{-3}$, between $1\times10^{17}$ cm$^{-3}$ and $5\times10^{19}$ cm$^{-3}$, between $1\times10^{17}$ cm$^{-3}$ and $1\times10^{19}$ cm$^{-3}$, between $1\times10^{17}$ cm$^{-3}$ and $5\times10^{18}$ cm$^{-3}$, between $1\times10^{17}$ cm$^{-3}$ and $1\times10^{18}$ cm$^{-3}$, between $1\times10^{17}$ cm$^{-3}$ and $5\times10^{17}$ cm$^{-3}$, between $5\times10^{17}$ cm$^{-3}$ and $1\times10^{21}$ cm$^{-3}$, between $1\times10^{18}$ cm$^{-3}$ and $5\times10^{20}$ cm$^{-3}$, between $5\times10^{18}$ cm$^{-3}$ and $1\times10^{20}$ cm$^{-3}$, and between $1\times10^{19}$ cm$^{-3}$ and $5\times10^{19}$ cm$^{-3}$. The noise reduction well 56 may be an n-type region with a thickness between 0.1 μm and 2.5 μm and a doping concentration between $1\times10^{17}$ cm$^{-3}$ and $5\times10^{21}$ cm$^{-3}$. In various embodiments, the thickness of the noise reduction well 56 may be provided within any subrange between 0.1 μm and 2.5 μm, or at any discrete point in the range. For example, the thickness of the noise reduction well 56 may be between 0.5 μm and 2.5 μm, between 1.0 μm and 2.5 μm, between 1.5 μm and 2.5 μm, between 2.0 μm and 2.5 μm, between 0.1 μm and 2.0 μm, between 0.1 μm and 1.5 μm, between 0.1 μm and 1.0 μm, between 0.1 μm and 0.5 μm, between 0.5 μm and 2.0 μm, and between 1.0 μm and 1.5 μm. Further, the doping concentration of the noise reduction well 56 may be provided in any subrange between $1\times10^{17}$ cm$^{-3}$ and $5\times10^{21}$ cm$^{-3}$, or at any discrete point within the range. For example, the doping concentration of the noise reduction well 56 may be between $5\times10^{17}$ cm$^{-3}$ and $5\times10^{21}$ cm$^{-3}$, between $1\times10^{18}$ cm$^{-3}$ and $5\times10^{21}$ cm$^{-3}$, between $5\times10^{18}$ cm$^{-3}$ and $5\times10^{21}$ cm$^{-3}$, between $1\times10^{19}$ cm$^{-3}$ and $5\times10^{21}$ cm$^{-3}$, between $5\times10^{19}$ cm$^{-3}$ and $5\times10^{21}$ cm$^{-3}$, between $1\times10^{20}$ cm$^{-3}$ and $5\times10^{21}$ cm$^{-3}$, between $5\times10^{20}$ cm$^{-3}$ and $5\times10^{21}$ cm$^{-3}$, between $1\times10^{21}$ cm$^{-3}$ and $5\times10^{21}$ cm$^{-3}$, between $1\times10^{17}$ cm$^{-3}$ and $1\times10^{21}$ cm$^{-3}$, between $1\times10^{17}$ cm$^{-3}$ and $5\times10^{20}$ cm$^{-3}$, between $1\times10^{17}$ cm$^{-3}$ and $1\times10^{20}$ cm$^{-3}$, between $1\times10^{17}$ cm$^{-3}$ and $5\times10^{19}$ cm$^{-3}$, between $1\times10^{17}$ cm$^{-3}$ and $1\times10^{19}$ cm$^{-3}$, between $1\times10^{17}$ cm$^{-3}$ and $5\times10^{18}$ cm$^{-3}$, between $1\times10^{17}$ cm$^{-3}$ and $1\times10^{18}$ cm$^{-3}$, between $1\times10^{17}$ cm$^{-3}$ and $5\times10^{17}$ cm$^{-3}$, between $5\times10^{17}$ cm$^{-3}$ and $1\times10^{21}$ cm$^{-3}$, between $1\times10^{18}$ cm$^{-3}$ and $5\times10^{20}$ cm$^{-3}$, between $5\times10^{18}$ cm$^{-3}$ and $1\times10^{20}$ cm$^{-3}$, and between $1\times10^{19}$ cm$^{-3}$ and $5\times10^{19}$ cm$^{-3}$.

The improvements discussed above, namely: separating the embedded sensor element 22 from the drift layer 14 with the insulating layer 16, providing the shielding well 46, minimizing the distance between the contact wells 48, providing the noise reduction well 56, providing the additional insulating layer 58, and providing the additional functional layer 60, either alone or in combination, may significantly improve the isolation of the embedded sensor element 22 from the drift layer 14. In particular, the improvements discussed herein may provide a DC isolation greater than 50V from the high-power portions of the semiconductor die 10, such as the source and the drain thereof. In various embodiments, the improvements discussed herein may provide DC isolation greater than 75V and greater than 100V. In general, the improvements discussed herein make it possible to include an embedded sensor element on a wide bandgap power semiconductor die, as without these isolation measures such an embedded sensor element would be subject to interference that would break the functionality thereof.

Figure 6:
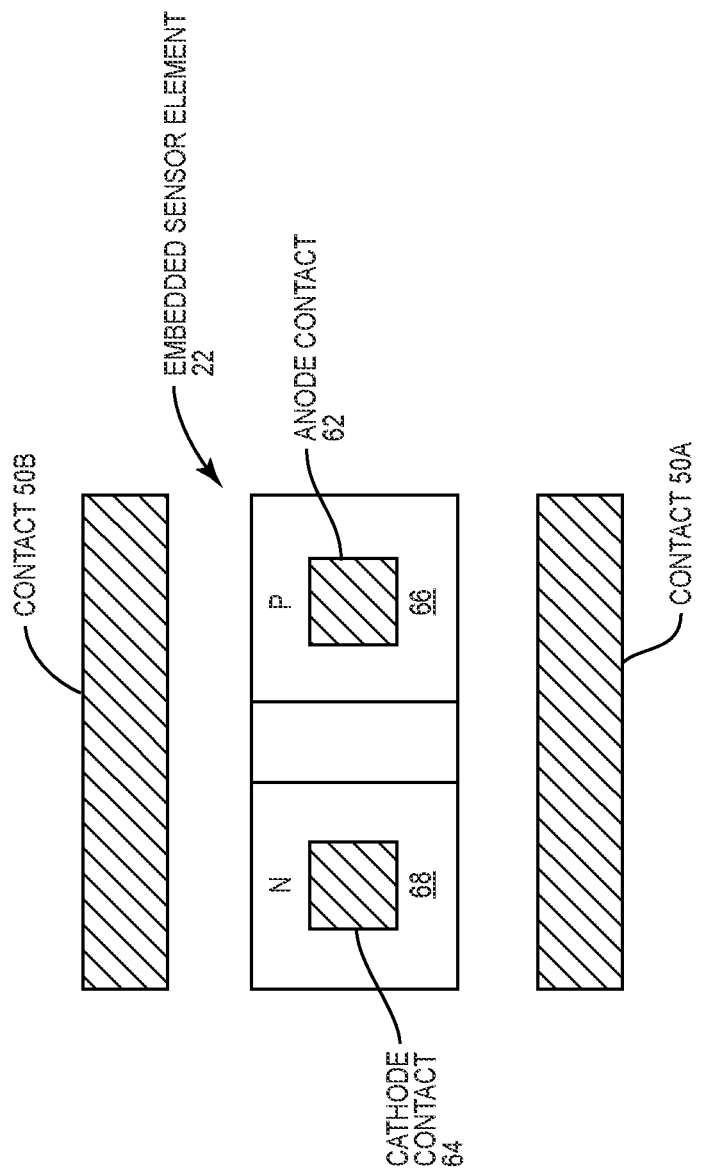
FIG. 6 is a top-down view of an embedded sensor element according to one embodiment of the present disclosure.

As discussed above, the embedded sensor element 22 can be any suitable sensing element. In one embodiment, the embedded sensor element 22 is a temperature sensing element. In particular, the embedded sensor element 22 may be a diode that provides a forward voltage drop that is proportional to temperature. Accordingly, FIG. 6 shows a top-down view of the embedded sensor element 22 according to one embodiment of the present disclosure. For context, the first contact 50A and the second contact 50B are also shown. The embedded sensor element 22 includes an anode contact 62 and a cathode contact 64. The anode contact 62 is in electrical contact with a p-type region 66 in the functional sensor layer 52. The cathode contact 64 is in electrical contact with an n-type region 68 in the functional sensor layer 52. The p-type region 66 and/or the n-type region 68 may be provided via an implantation process of the functional sensor layer 52 according to well-known processes. As shown, the p-type region 66 and the n-type region 68 may be separated by an region of material. This region of material may be intrinsic (undoped), or doped in a different manner to the p-type region 66 and the n-type region 68.

Figure 7:
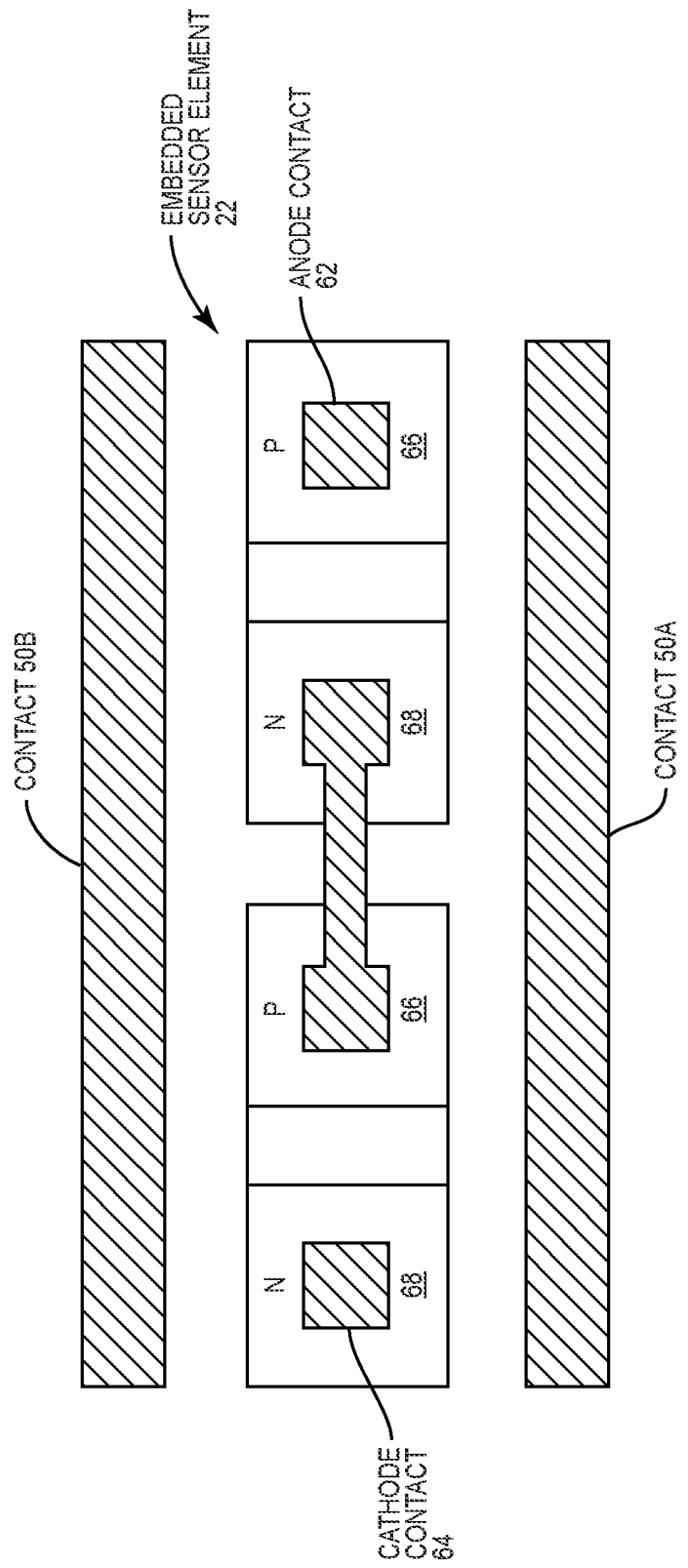
FIG. 7 is a top-down view of an embedded sensor element according to one embodiment of the present disclosure.

In some scenarios, it may be desirable to provide several diodes in series to tailor the forward voltage to a particular sensing circuitry. Accordingly, FIG. 7 shows a top-down view of the embedded sensor element 22 according to an additional embodiment of the present disclosure. The embedded sensor element 22 shown in FIG. 7 is substantially the same as that shown in FIG. 6 except that it includes two diodes instead of one. The functional sensor layer 52 is separated into two distinct portions, each of which is used to form a discrete diode. These diodes are coupled together via a metal layer as shown. While only two diodes are shown, those skilled in the art will appreciate that the embedded sensor element 22 may include any number of discrete elements including diodes without departing from the principles of the present disclosure.

Figure 8:
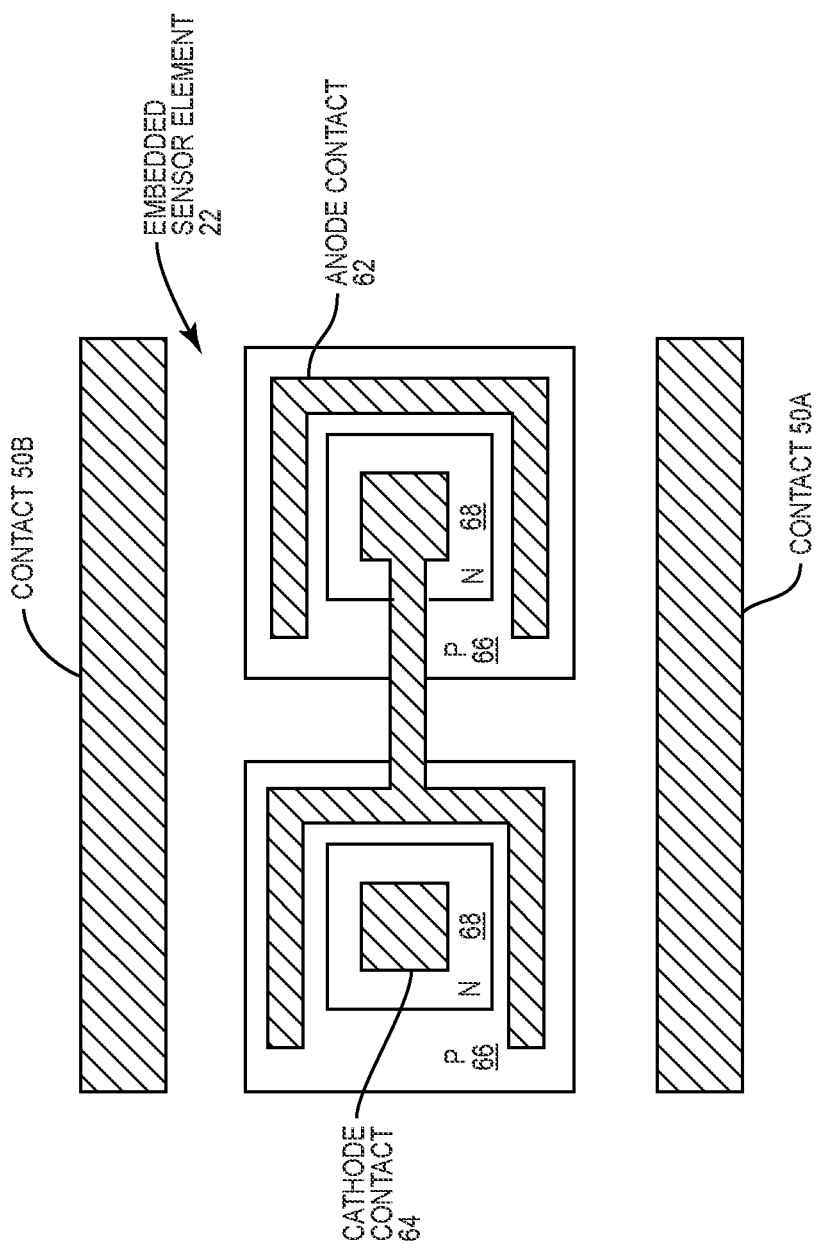
FIG. 8 is a top-down view of an embedded sensor element according to one embodiment of the present disclosure.

FIG. 8 shows a top-down view of the embedded sensor element 22 according to an additional embodiment of the present disclosure. The embedded sensor element 22 shown in FIG. 8 is substantially similar to that shown in FIG. 7, except that the p-type region 66 and the n-type region 68 are nested, which may reduce the area required for each diode. Those skilled in the art will appreciate that diodes can be formed using any number of layout techniques, all of which are contemplated herein.

Figure 9:
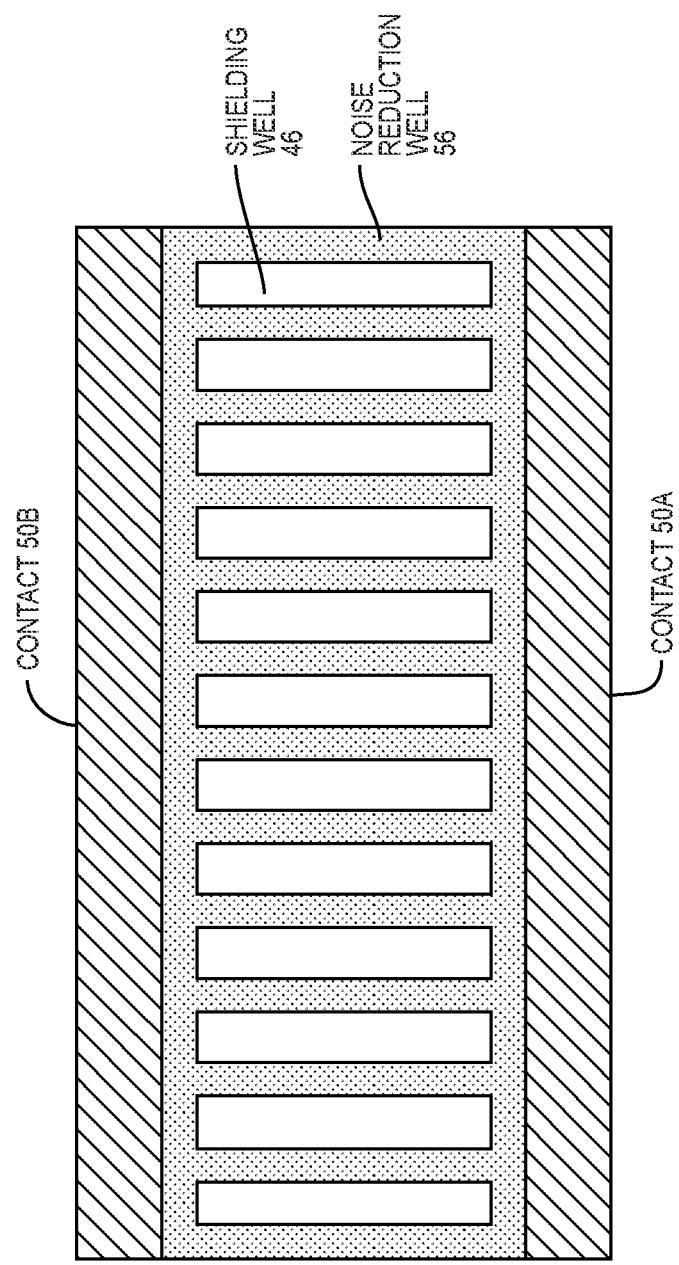
FIG. 9 is a top-down view of a portion of a shielding structure for an embedded sensor element according to one embodiment of the present disclosure.
Figure 10:
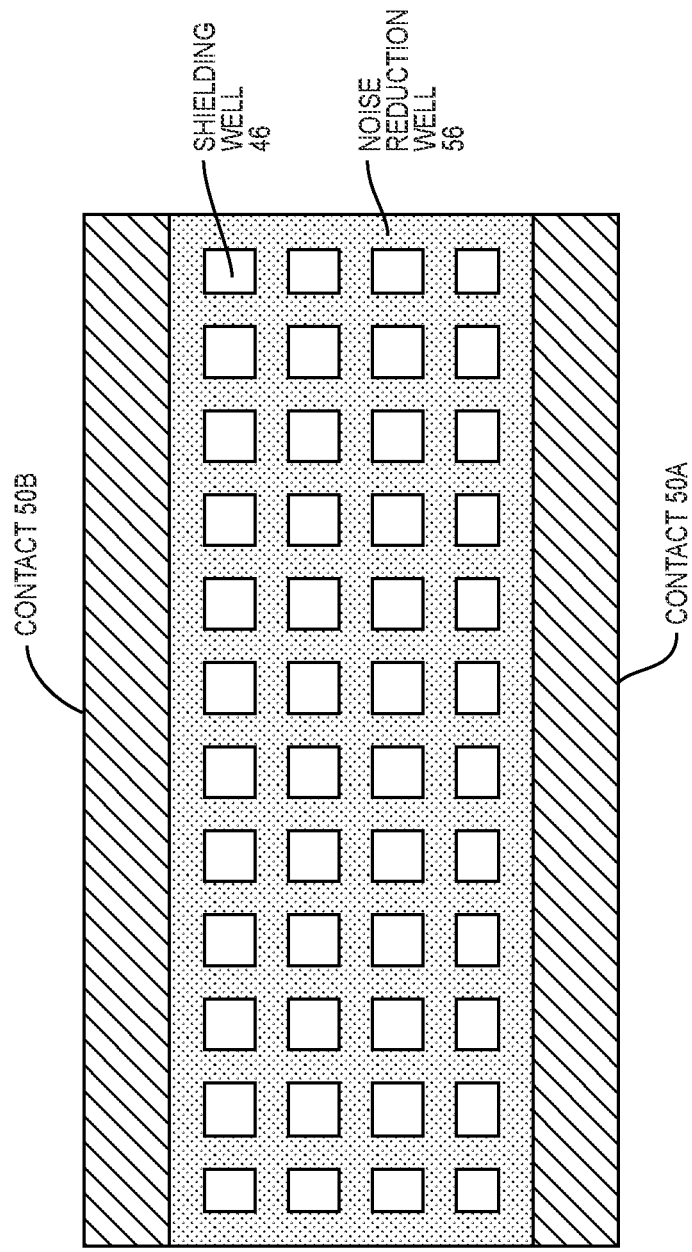
FIG. 10 is a top-down view of a portion of a shielding structure for an embedded sensor element according to one embodiment of the present disclosure.

In some embodiments, the noise reduction well 56 is a blanket region below the entirety of the embedded sensor element 22. However, this may provide a parasitic N-P-N transistor that can be problematic in some situations. Accordingly, the noise reduction well 56 may be patterned in some embodiments as shown in FIGS. 9 and 10. FIGS. 9 and 10 show a top-down view of the noise reduction well 56 without the embedded sensor element 22 or the insulating layer 16 to avoid obscuring the drawing. In FIG. 9, the noise reduction well 56 is provided in a first wide grid pattern, while in FIG. 10 the noise reduction well 56 is provided in a tight grid pattern. Notably, these are only exemplary patterns and those skilled in the art will readily appreciate that any suitable pattern can be used for the noise reduction well 56 without departing from the principles of the present disclosure.

Figures 11A, 11B:
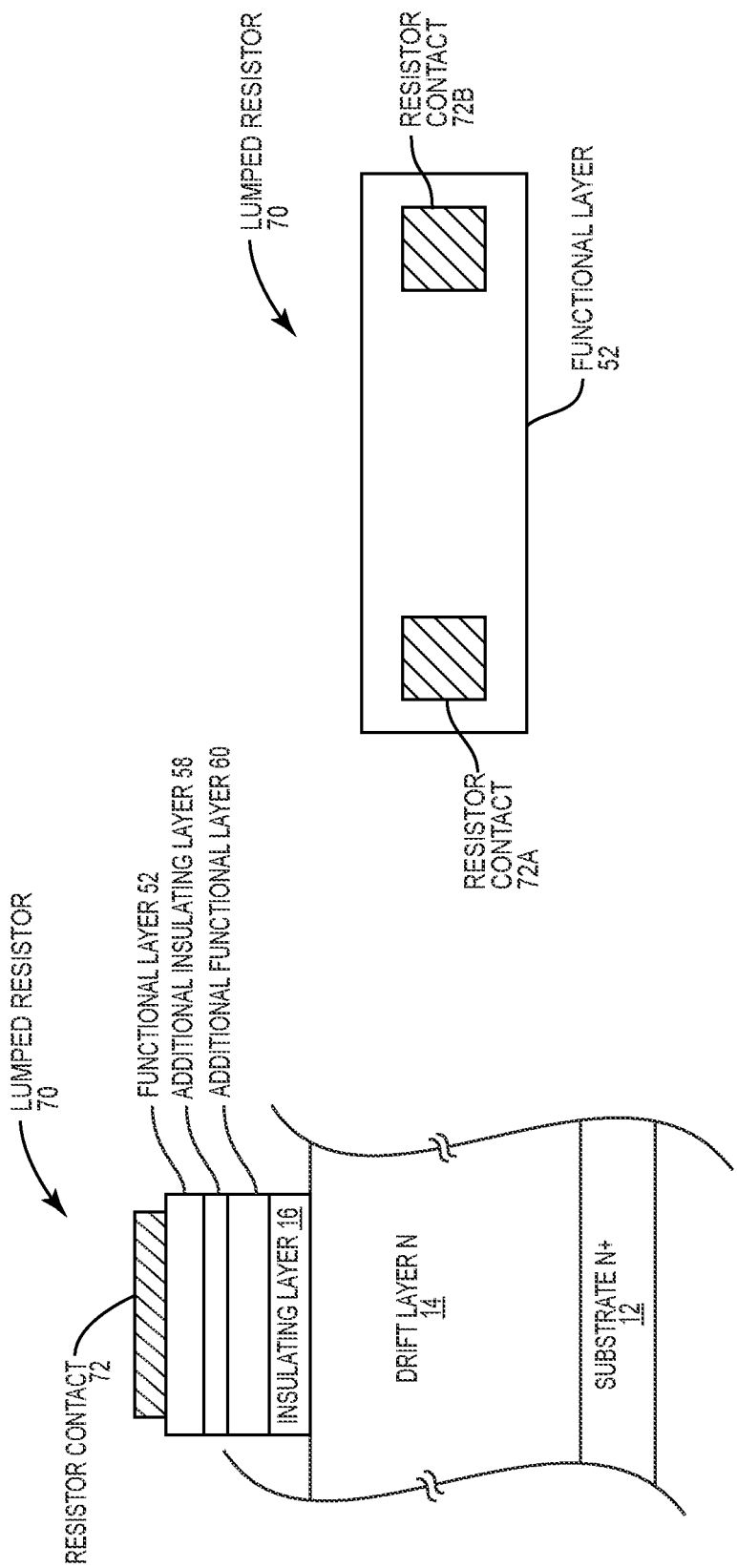
FIG. 11A is a cross-sectional view of a functional component according to one embodiment of the present disclosure.
FIG. 11B is a top-down view of a functional component according to one embodiment of the present disclosure.

Turning back to the embodiment discussed above with respect to FIGS. 4 and 5, providing the embedded sensor element 22 on a second-level polysilicon layer may allow for the implementation of other functional components in addition to the embedded sensor element 22. For example, a lumped resistor, which can be used as a gate resistor for a MOSFET, can be implemented in the second polysilicon layer along with the embedded sensor element 22. FIG. 11A thus shows a cross-sectional view of a lumped resistor 70 according to one embodiment of the present disclosure. The lumped resistor 70 is provided in the functional layer 52, which is the same as the functional sensor layer 52 discussed above. Specifically, the lumped resistor 70 is provided via a doped portion of polysilicon having a first resistor contact 72A and a second resistor contact 72B, as shown in the top-down view of the lumped resistor in FIG. 11B. The lumped resistor 70 may be coupled to the gate contact 40 of the MOSFET cell 24 in order to provide an on-chip gate resistor. In some embodiments, one of the resistor contacts 72 may provide a gate contact pad. In such a case, only one of the resistor contacts 72 may be provided and the lumped resistor 70 may be coupled to the gate contact internally. However, in other embodiments one of the resistor contacts 72 may be a gate contact pad and the other may be exposed to allow for measuring a resistance of the lumped resistor 70 during manufacturing to ensure that a desired resistance is achieved. As discussed above, the functional sensor layer 52 may be a polysilicon layer that is doped during growth (in-situ) to provide a desired resistance or later doped via an implantation process such as ion implantation. While the lumped resistor 70 is shown as a simple rectangle in FIGS. 11A and 11B, the lumped resistor 70 may be provided in any number of shapes. For example, the portion of the functional sensor layer 52 that forms the lumped resistor 70 may be provided in a circular shape, a polygonal shape, or any other shape. Providing the lumped resistor 70 in this manner may improve performance when the lumped resistor 70 is used as a gate resistor by improving current distribution and/or reducing parasitic signals. Those skilled in the art will appreciate that in addition to resistors, other functional components may also be implemented in the second-level polysilicon layer.

While not shown in the Figures above, the various metal contacts such as the source contact 38, the drain contact 42, the contacts 50, and the resistor contacts 72 may not be provided directly on the area they are electrically coupled to. Rather, any number of passivation or encapsulation layers may separate these contacts from the areas of the semiconductor die 10 they contact, and connections between them may be provided with vias through these layers.

Figure 12:
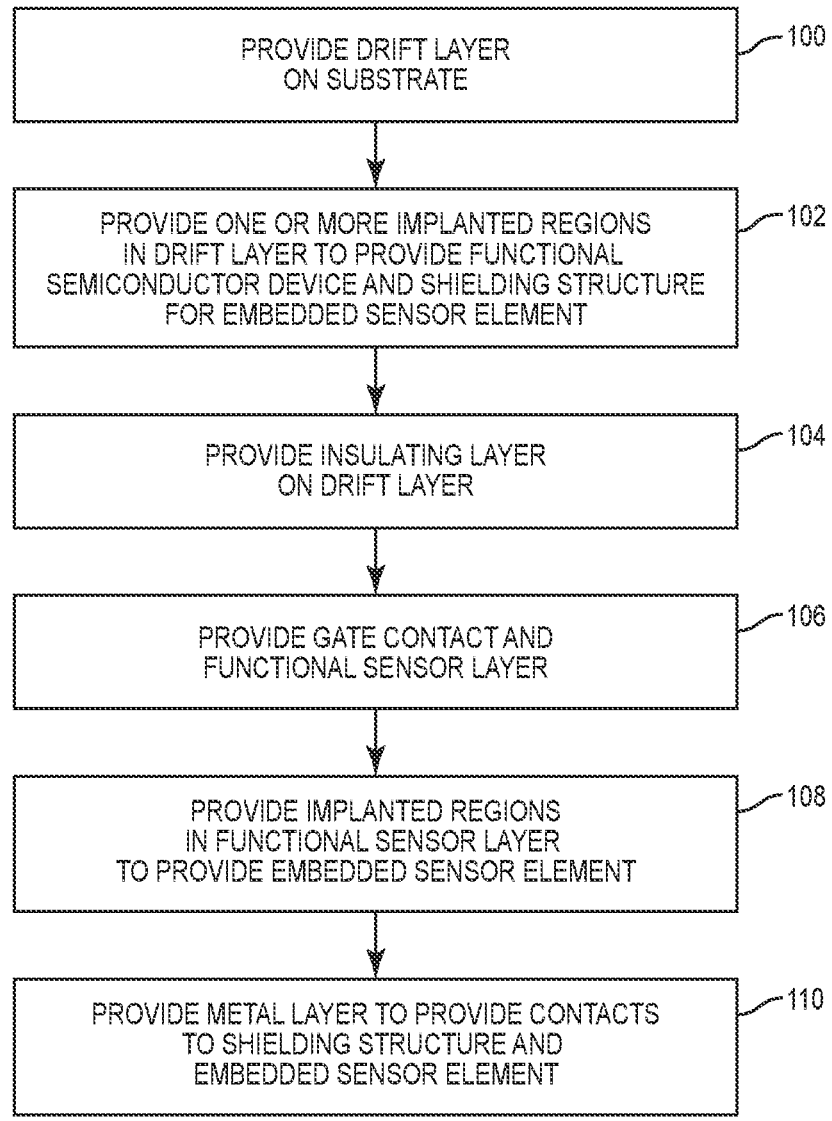
FIG. 12 is a flow diagram illustrating a method for manufacturing a semiconductor die according to one embodiment of the present disclosure.

FIG. 12 is a flow diagram illustrating a method for manufacturing a semiconductor die including an embedded sensor element according to one embodiment of the present disclosure. First, a drift layer is provided on a substrate (step 100). The drift layer comprises a wide bandgap semiconductor material. Providing the drift layer may comprise growing the drift layer according to any suitable semiconductor growth processes. One or more implants are provided in the drift layer (step 102) to provide a functional semiconductor device such as a MOSFET, a BJT, an IGBT, or a thyristor as well as a shielding structure for an embedded sensor element. The shielding structure for the embedded sensor element may include one or more of the shielding well, the contact wells, and the noise reduction well discussed above. The implanted regions may be provided by any suitable implantation process. An insulating layer is provided on the drift layer (step 104). The insulating layer may provide a gate oxide and a field oxide in different parts of the semiconductor die, and thus may be provided having different thicknesses in different portions thereof. A gate contact and functional sensor layer are provided on the insulating layer (step 106). The gate contact and the functional sensor layer may be a polysilicon layer that is provided by any suitable deposition process. The polysilicon layer may be deposited and patterned to create the gate contact and the functional sensor layer. In some embodiments, the gate contact and the functional sensor layer are not provided simultaneously. Instead, the gate contact and an additional polysilicon layer are provided together, an additional insulating layer is provided on the additional polysilicon layer, and the functional sensor layer is provided on the additional insulating layer. The result of this approach is shown in FIGS. 4 and 5 above. One or more implanted regions are then provided in the functional sensor layer to provide an embedded sensor element (step 108). For example, a p-type region and/or an n-type region may be provided to form a diode, which is used as a temperature sensor. Finally, a metal layer is provided, at least a portion of which is used to provide electrical contacts to the shielding structure and the embedded sensor element (step 110). In some embodiments, multiple metal layers may be provided, with passivation or inter-metal dielectric layers being provided between.

Figure 13:
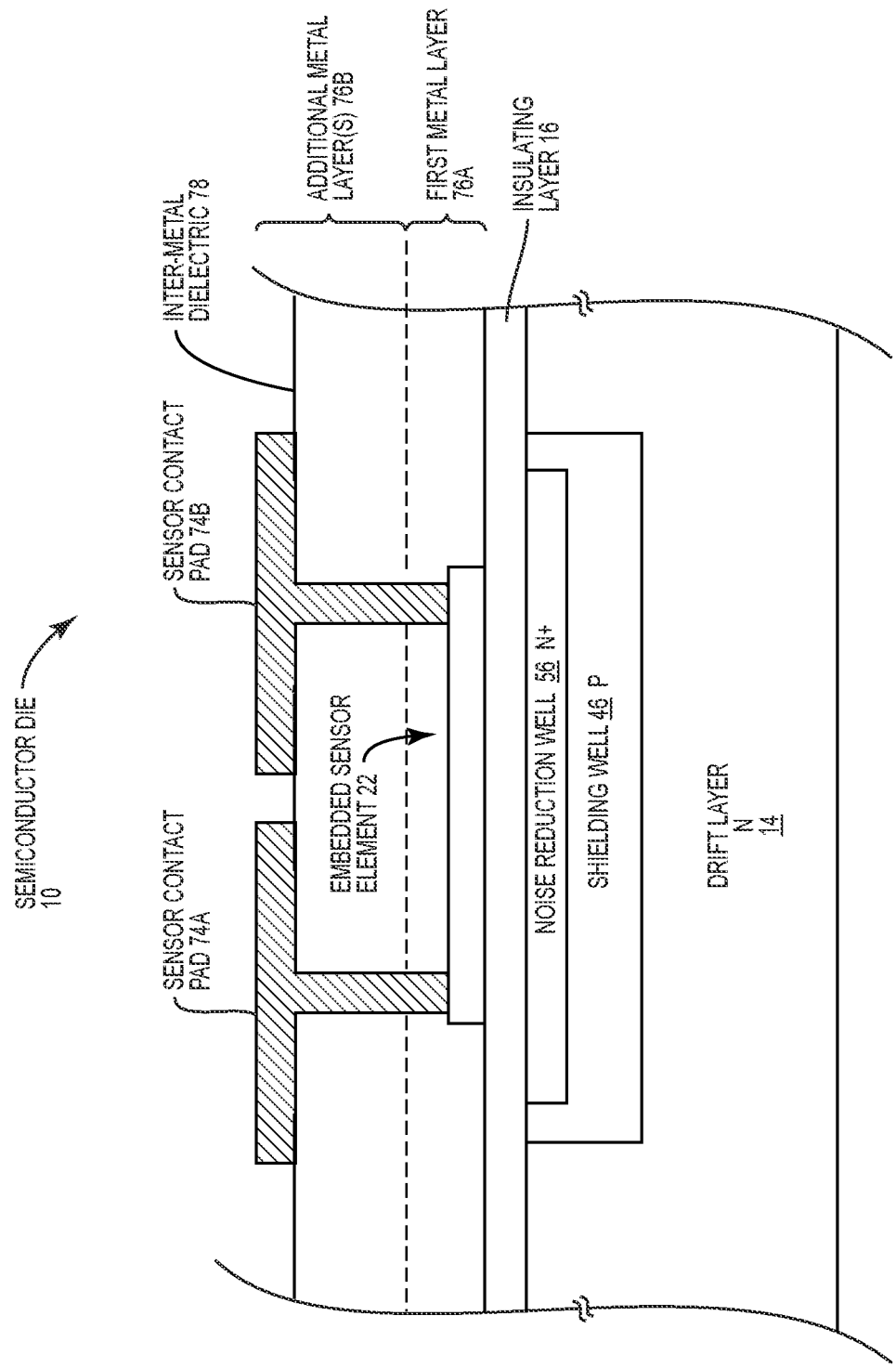
FIG. 13 is a cross-sectional view of an embedded sensor element according to one embodiment of the present disclosure.

FIG. 13 illustrates a cross-sectional view of the embedded sensor element 22 according to one embodiment of the present disclosure. The embedded sensor element 22 is substantially similar to that shown in FIG. 2, except that the cross-sectional view is perpendicular to the one shown in FIG. 2 (i.e., across the embedded sensor element 22 into the page with reference to FIG. 2), and a pair of sensor contact pads 74 is shown. Those skilled in the art will appreciate that to make electrical connections with a portion of a semiconductor die, a contact pad having certain minimum dimensions must be provided. The minimum dimensions may be based on a minimum size at which a desired electrical connection, such as one or more wirebonds, can be achieved within certain process limitations. Since the sensor contact layer 54 shown in FIG. 2 may be coplanar with one or more other metal features (e.g., the source contact 38, the contacts 50, a gate metal layer, or the like), the area available for a contact pad within this layer may be limited so that the contact pad does not overlap and thus come into electrical contact with these features. Accordingly, FIG. 13 shows the contacts 50 being implemented in a first metal layer 76A and the sensor contact pads 74 being implemented in one or more additional metal layers 76B. An inter-metal dielectric layer 78 is provided over the first metal layer 76A and provides a surface on which the sensor contact pads 74 can be provided. Notably, when the sensor contact pads 74 are provided on the inter-metal dielectric layer 78, there is much more room for providing the contact pads, since they can overlap with the contacts 50 in the first metal layer 76 below. By moving the sensor contact pads 74 onto an additional metal layer, the area available for the sensor contact pads 74 is increased. This may provide more reliable contact with the embedded sensor element 22 and thus improve performance in some embodiments.

Figure 14:
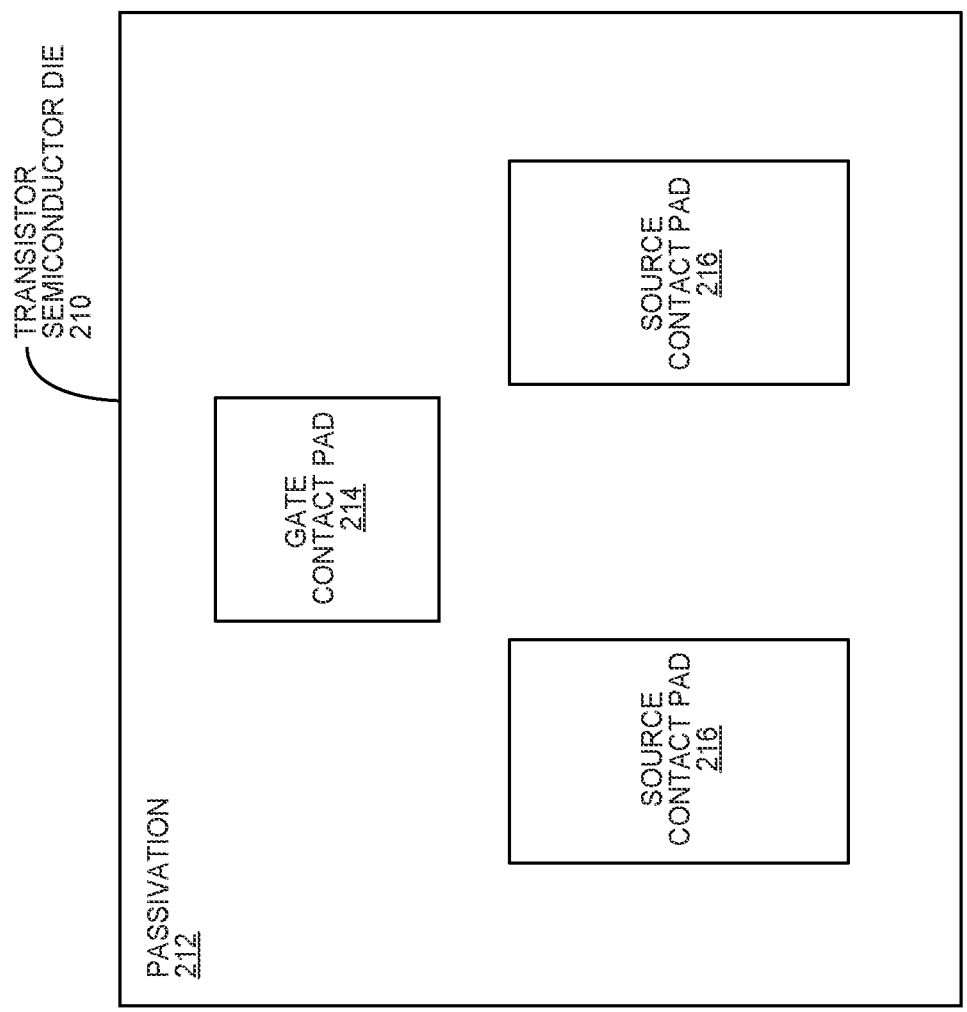
FIG. 14 is a top down view of a transistor semiconductor die according to one embodiment of the present disclosure.

To further illustrate the aspects of the present disclosure wherein one or more additional metal layers are used to provide space for contact pads, FIG. 14 shows a top view of a transistor semiconductor die 210 according to one embodiment of the present disclosure. For purposes of illustration, the transistor semiconductor die 210 is a vertical metal-oxide-semiconductor field-effect transistor (MOSFET) device including a passivation layer 212 with openings for a gate contact pad 214 and a number of source contact pads 216. The transistor semiconductor die 210 is a vertical power device in which a drain contact pad (not shown) is located on a backside of the device. The gate contact pad 214 and the source contact pads 216 may be provided as surfaces for coupling the transistor semiconductor die 210 to external circuitry. Accordingly, the gate contact pad 214 and the source contact pads 216 may have a minimum size so that they can be reliably connected to. In one embodiment, a minimum size of the gate contact pad 214 and each one of the source contact pads 216 is 0.4 mm$^2$. In various embodiments, a minimum size of the gate contact pad 214 and each one of the source contact pads 216 may be 0.5 mm$^2$, 0.6 mm$^2$, 0.7 mm$^2$, 0.8 mm$^2$, 0.9 mm$^2$, and up to 1.0 mm$^2$.

Figure 15:
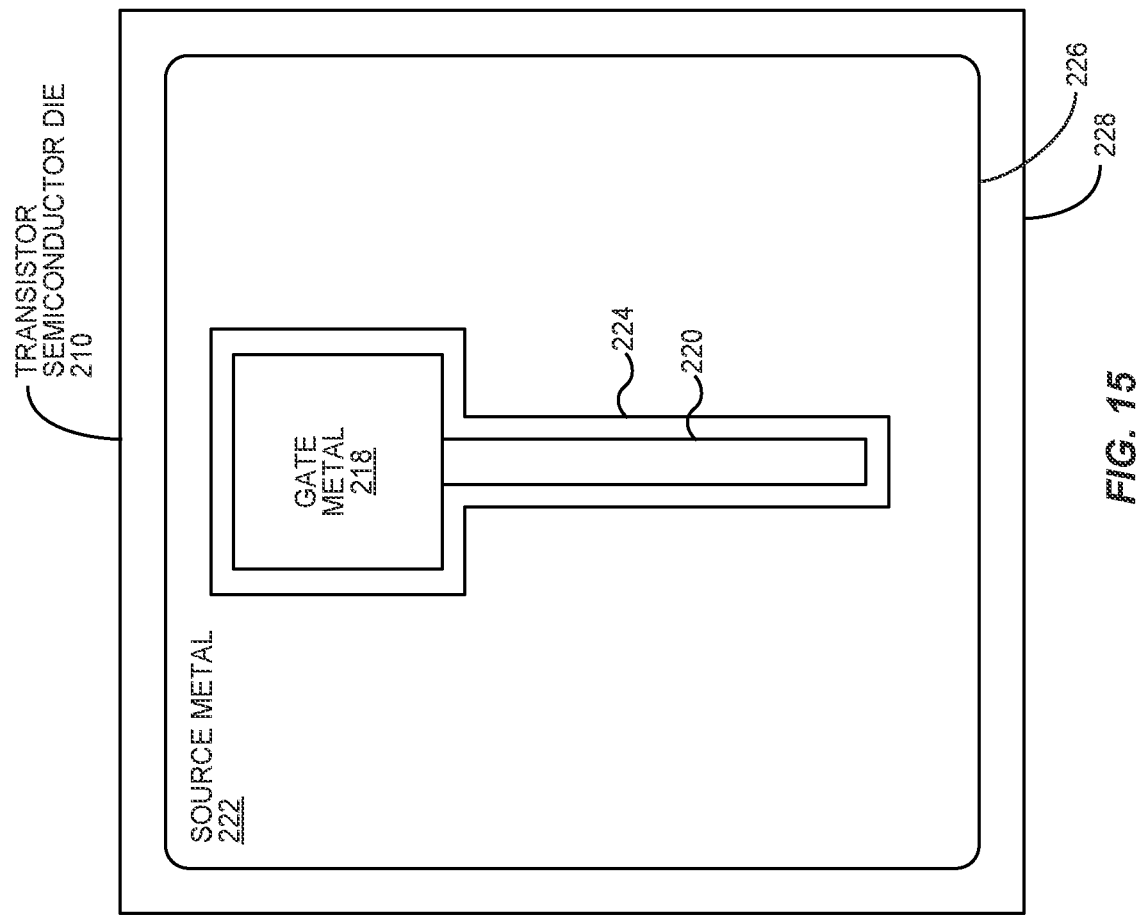
FIG. 15 is a top down view of a transistor semiconductor die according to one embodiment of the present disclosure.

FIG. 15 shows a top view of the transistor semiconductor die 210 with the passivation layer 212 removed. Underneath the passivation layer 212 is a gate metal layer 218, a gate via bar 220 coupled to the gate metal layer 218, and a source metal layer 222. As discussed in more detail below, the gate metal layer 218, the gate via bar 220, and the source metal layer 222 are provided by the same metallization layer, and thus the source metal layer 222 must include an opening 224 to accommodate the entire area of the gate metal layer 218 and the gate via bar 220 as shown. FIG. 15 also shows a device region 226 and an edge termination region 228 of the transistor semiconductor die 210. As discussed above, the device region 226 is the region of the transistor semiconductor die 210 including one or more implants, which are electrically coupled to one or more electrodes, for providing the selective current conducting and voltage blocking capabilities of the device. The edge termination region 228 is provided to decrease the concentration of electric fields at the edges of the transistor semiconductor die 210 and thus prevent breakdown at low reverse voltages.

Figure 16:
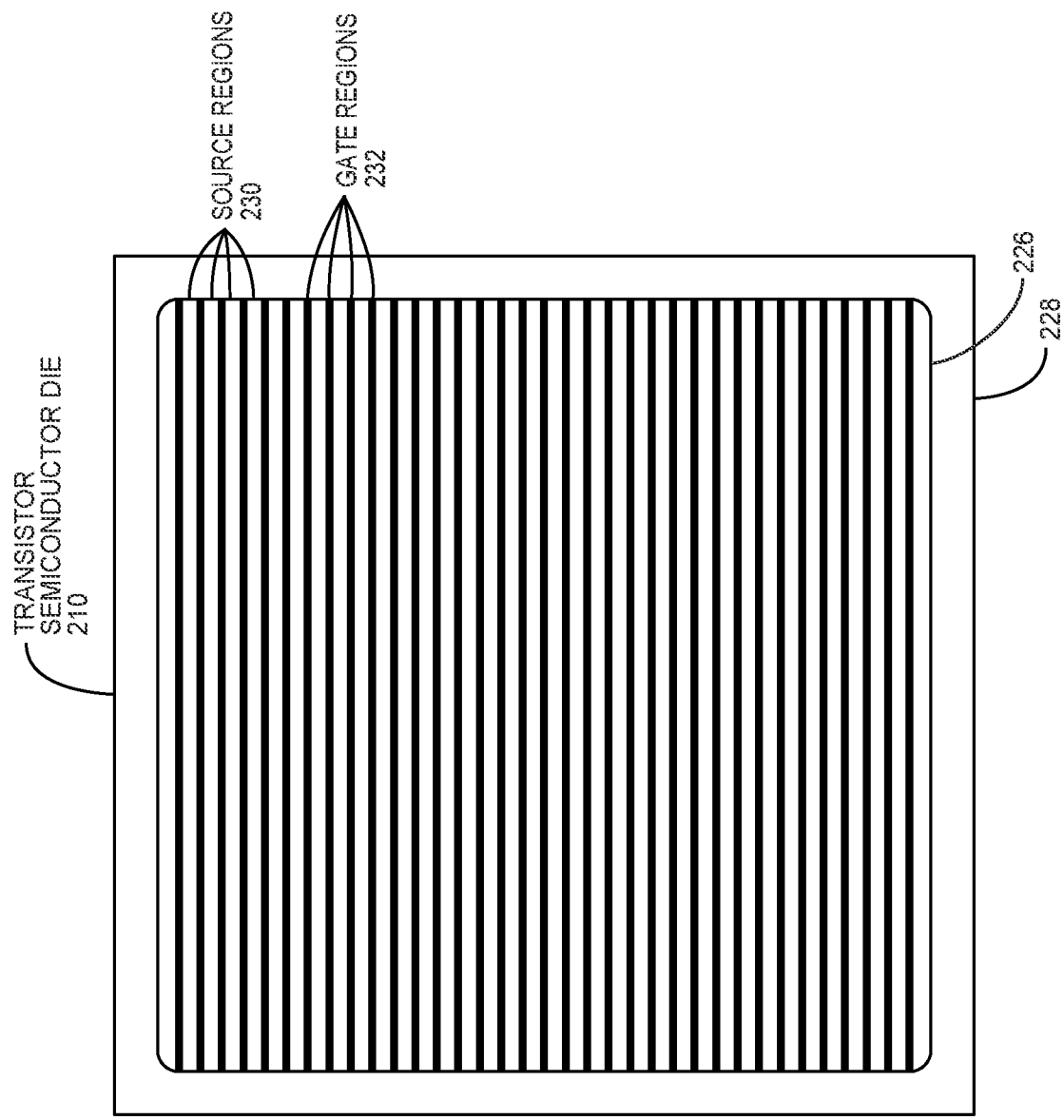
FIG. 16 is a top down view of a transistor semiconductor die according to one embodiment of the present disclosure.
Figure 17:
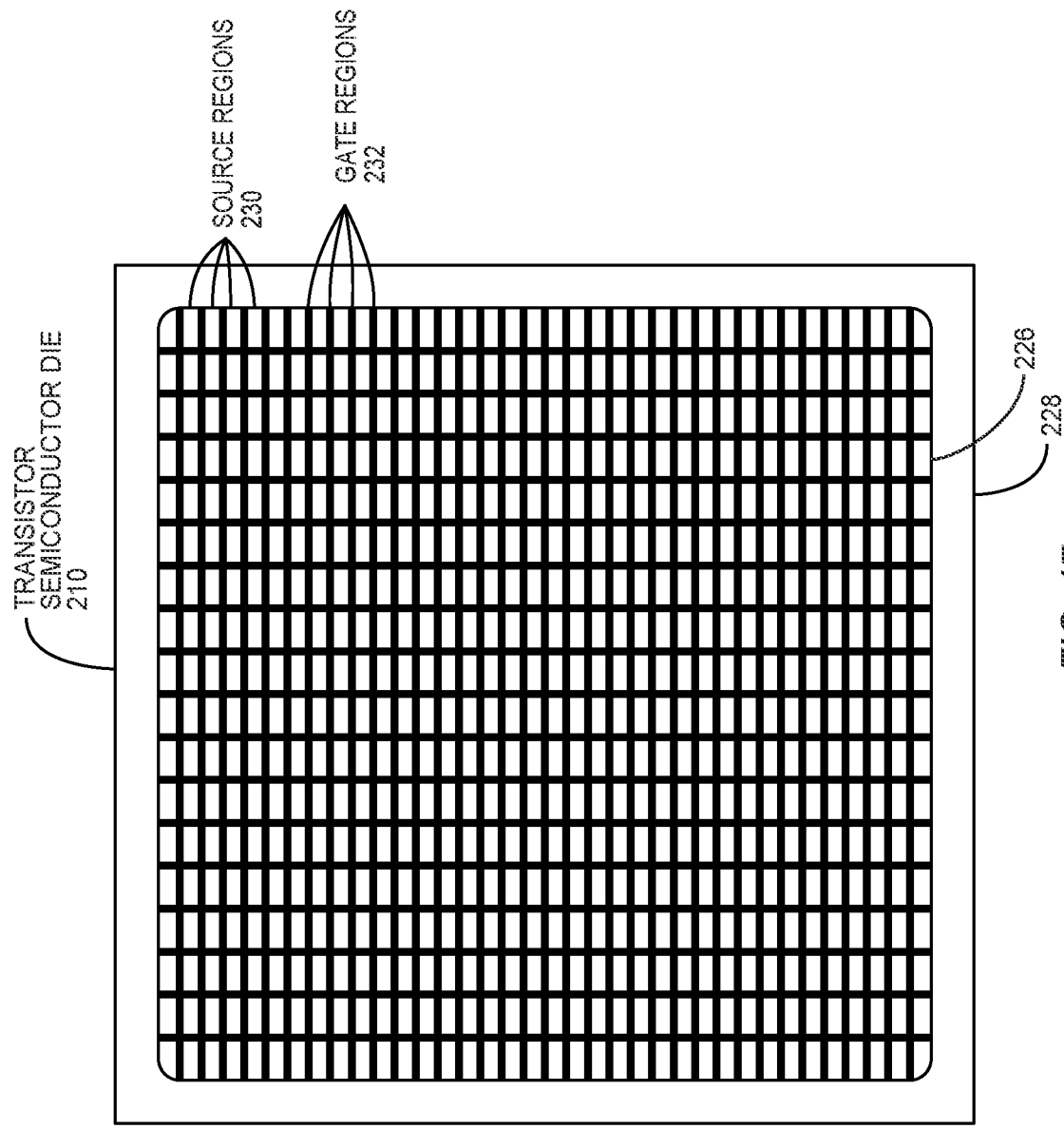
FIG. 17 is a top down view of a transistor semiconductor die according to one embodiment of the present disclosure.

FIG. 16 shows a top-down view of the transistor semiconductor die 210 with the gate metal layer 218, the gate via bar 220, the source metal layer 222, and a number of other layers (discussed below) removed. Underneath these layers is a number of source regions 230 separated by a number of gate regions 232. The source regions 230 may be provided as regions having a doping type and/or doping concentration that is different than that of a drift layer in which they are located (e.g., via a separate epitaxy process from the drift layer or by implantation of the drift layer), while the gate regions 232 may be provided as regions wherein a doping type and/or doping concentration of the drift layer is relatively unchanged or changed by a different amount. As shown in FIG. 16, the gate regions 232 are provided as stripes, however, the gate regions 232 may similarly be provided in a grid as illustrated in FIG. 17. To provide the primary functionality of the transistor semiconductor die 210, the gate contact pad 214 must be in electrical contact with the gate regions 232, while the source contact pads 216 must be in electrical contact with the source regions 230.

Figure 18:
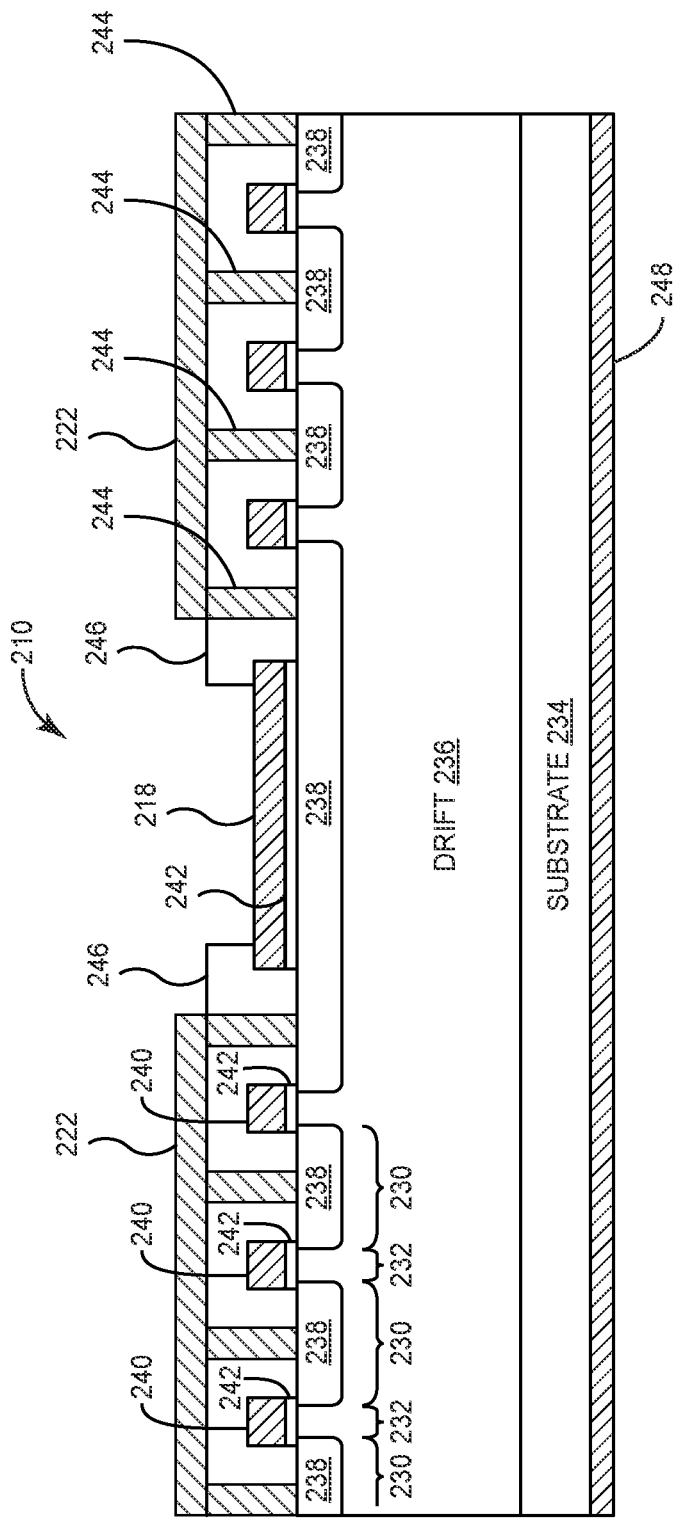
FIG. 18 is a cross-sectional view of a transistor semiconductor die according to one embodiment of the present disclosure.

FIG. 18 shows a cross-sectional view of a portion of the transistor semiconductor die 210 according to one embodiment of the present disclosure. The transistor semiconductor die 210 includes a substrate 234 and a drift layer 236 over the substrate 234. A number of implants 238 in a surface of the drift layer 236 provide the source regions 230, while a number of non-implanted regions between the implants 238 provide the gate regions 232. A number of gate electrodes 240 are provided on the gate regions 232 such that each one of the gate electrodes 240 runs between the implants 238 on either side of the gate region 32 over which they are provided. Each one of the gate electrodes 240 is separated from the surface of the drift layer 236 by an oxide layer 242. A number of source electrodes 244 are provided on the source regions 230 such that each one of the source electrodes 244 is in contact with a different one of the implants 238. The gate metal layer 218 is provided on the surface of the drift layer 236 such that the gate metal layer 218 is separated from the surface of the drift layer 236 by the oxide layer 242 and coupled to each one of the gate electrodes 240 on a plane not shown in FIG. 18. To keep the gate electrodes 240 electrically isolated from the source electrodes 244, a dielectric layer 246 is provided over the gate electrodes 240. The source electrodes 244 are exposed at a surface of the dielectric layer 246. The source metal layer 222 is provided on the dielectric layer 246 such that it is in contact with the source electrodes 244. A drain metal layer 248 is provided on the substrate 234 opposite the drift layer 236.

As shown in FIG. 15 and FIG. 18, the source metal layer 222 and the gate metal layer 218 are provided within the device region 226 of the transistor semiconductor die 210 in a single metallization step (i.e., as a single metal layer that is appropriately patterned). This means that the source metal layer 222 and the gate metal layer 218 are provided on the same surface/plane of the transistor semiconductor die 210. Accordingly, the source metal layer 222 cannot overlap with the gate metal layer 218, and instead must include an opening for the gate metal layer 218. Due to constraints on the size of the gate metal layer 218 (e.g., minimum contact pad size for wirebonding), the coverage of the source metal layer 222 is thus limited within the device region 226 of the transistor semiconductor die 210. As shown in FIG. 18, the area below the source metal layer 222 is active area in which current is carried by the drift layer 236 from the source metal layer 222 to the drain metal layer 248. The area below the gate metal layer 218 is inactive area, since current cannot be carried by the drift layer 236 below the gate metal layer 218. Accordingly, the total active area of the device region 226 and thus the total current carrying capacity of the transistor semiconductor die 210 may be limited for a given size of the die.

Figure 19:
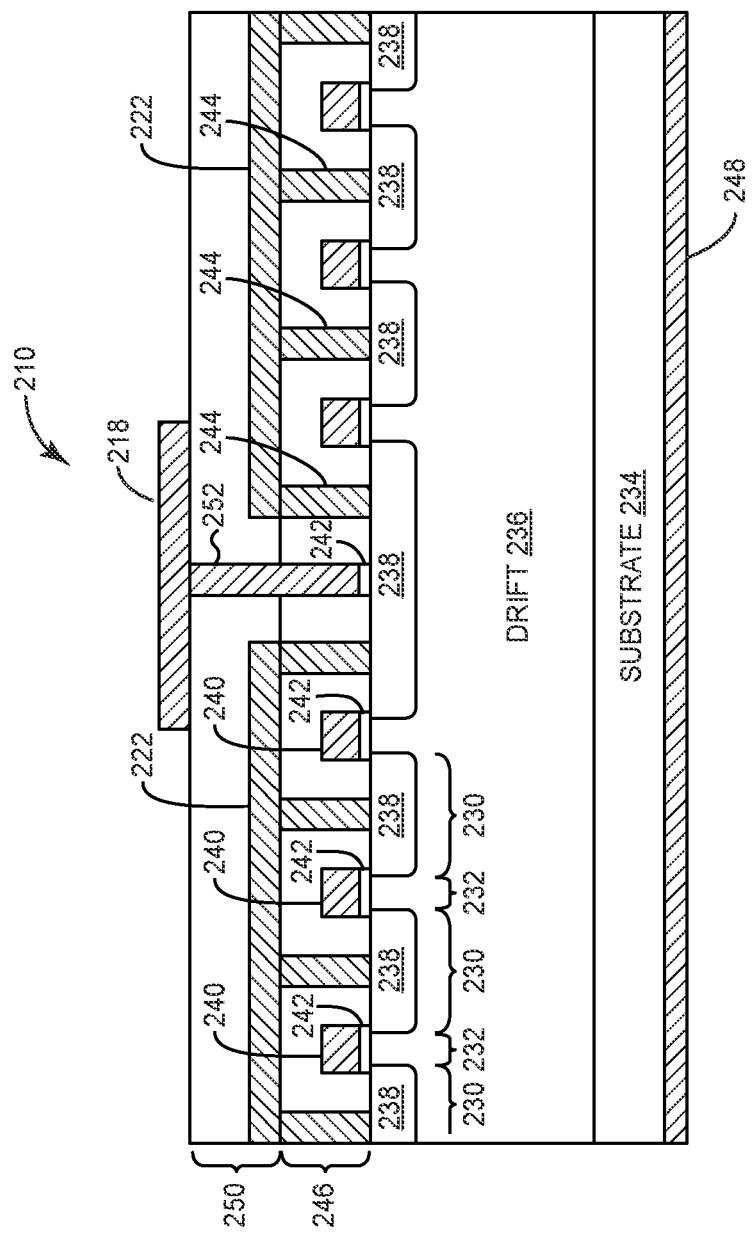
FIG. 19 is a cross-sectional view of a transistor semiconductor die according to one embodiment of the present disclosure.

Accordingly, FIG. 19 shows a cross-sectional view of the transistor semiconductor die 210 according to an additional embodiment of the present disclosure. The transistor semiconductor die 210 shown in FIG. 19 is substantially similar to that shown in FIG. 18, but further includes an additional dielectric layer 250 over the dielectric layer 246. Specifically, the gate electrodes 240 and the source electrodes 244 are provided on the surface of the drift layer 236, the dielectric layer 246 is provided over the gate electrodes 240 and the source electrodes 244 such that the gate electrodes 240 are electrically isolated from the source electrodes 244 and the source electrodes 244 are exposed at a surface of the dielectric layer 246, the source metal layer 222 is provided over the dielectric layer 246, the additional dielectric layer 250 is provided over the dielectric layer 246 and the source metal layer 222, and the gate metal layer 218 is provided over the additional dielectric layer 250. The gate metal layer 218 is electrically coupled to the gate electrodes 240 by one or more vias 252 running through the dielectric layer 246 and the additional dielectric layer 250 (connected on a plane not shown in FIG. 19). As illustrated, providing the additional dielectric layer 250 allows at least a portion of the gate metal layer 218 to overlap the source metal layer 222. The one or more vias 252 are very small in comparison to the total area of the gate metal layer 218. Accordingly, only a very small opening in the source metal layer 222 is required, and the total area covered by the source metal layer 222 is thus increased. Since, as discussed above, the area below the source metal layer 222 is active area of the transistor semiconductor die 210, this effectively increases the total active area and thus current carrying capacity of the transistor semiconductor die. In effect, a total inactive area of the device region 226 of the transistor semiconductor die 210 may be less than a total area of the gate metal layer 218, and less than a total area of the gate contact pad 214 in some embodiments, which was not previously achievable.

Increasing the active area of the transistor semiconductor die 210 allows for an increase in current carrying capacity for a given size. Alternatively, increasing the active area of the transistor semiconductor die 210 allows for a decrease in size of the die without sacrificing current carrying capacity. This in turn allows for additional chips to be provided for a given wafer when fabricating the transistor semiconductor die 210. While the examples discussed herein relate primarily to transistor semiconductor die 210 providing MOSFET devices, the principles described herein apply equally to transistor semiconductor die 210 providing field-effect transistor (FET) devices, bipolar junction transistor (BJT) devices, insulated gate bipolar transistor (IGBT) devices, or any other type of vertical transistor device with two or more top-level contacts. With this in mind, the gate contact pad 214 may be referred to generically as a first contact pad, the source contact pads 216 may be referred to generically as a second contact pad, the source metal layer 222 may be referred to generically as a first metallization layer, the gate metal layer 218 may be referred to generically as a second metallization layer, the source regions 230 may be referred to generically as a first set of regions, and the gate regions may be referred to generically as a second set of regions.

In one embodiment, the substrate 234 and the drift layer 236 are silicon carbide. Using silicon carbide for the substrate 234 and the drift layer 236 may increase the performance of the transistor semiconductor die 210 significantly when compared to using conventional material systems such as silicon. While not shown, the implants 238 may include several different implanted regions therein as necessary to provide the selective current conduction and voltage blocking capabilities of the transistor semiconductor die 210. The dielectric layer 246 and the additional dielectric layer 250 may comprise one or more layers of $Al_2O_3$ and $SiO_2$, for example, in an alternating fashion. In other embodiments, the dielectric layer 246 and the additional dielectric layer 250 may comprise one or more layers of $Si_3N_4$ and $SiO_2$, for example, in an alternating fashion. In general, the dielectric layer 246 and the additional dielectric layer 250 may comprise any suitable dielectric materials (e.g., those having a wide bandgap (>~5 eV) and a relatively low dielectric constant). The dielectric layer 246 and the additional dielectric layer 250 may comprise the same or different materials. Additional passivation layers comprising $Si_3N_4$, $Al_2O_3$, AlN, $SiO_2$, or any other suitable materials may be interleaved with the dielectric layer 246 and the additional dielectric layer 250 as necessary to avoid interactions between materials. The passivation layer 212 may comprise $Si_3N_4$, $Al_2O_3$, AlN, $SiO_2$, or any other suitable materials in various embodiments.

Figure 20B:
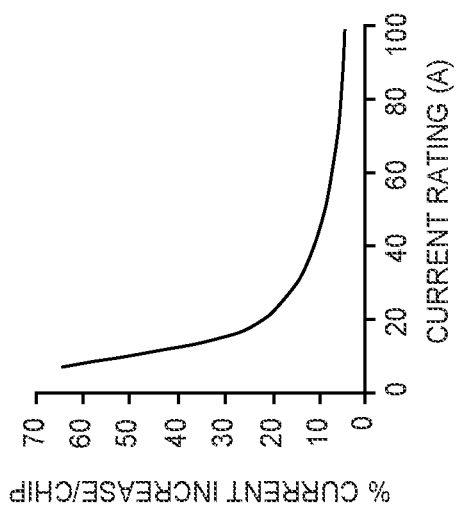
FIGS. 20A through 20C are graphs illustrating the performance of a transistor semiconductor die according to various embodiments of the present disclosure.
Figure 20C:
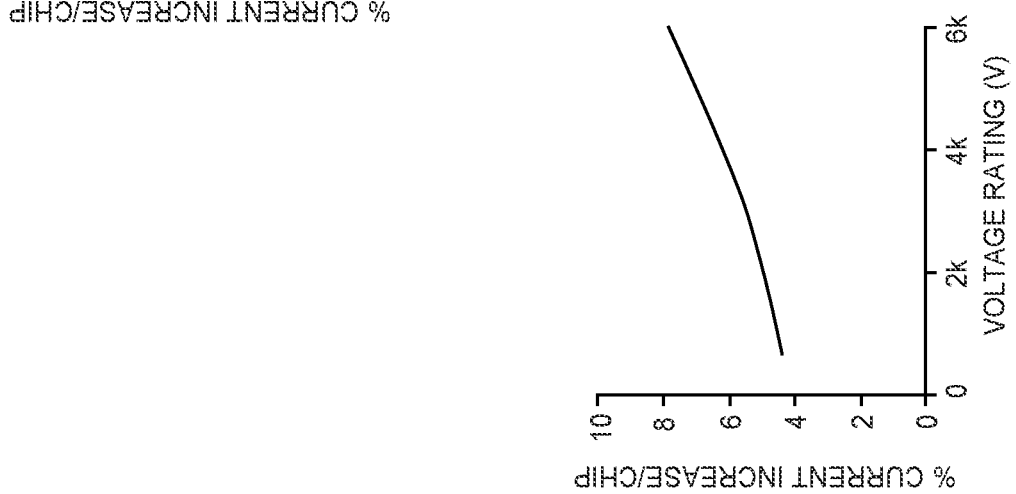
Figure 20A:
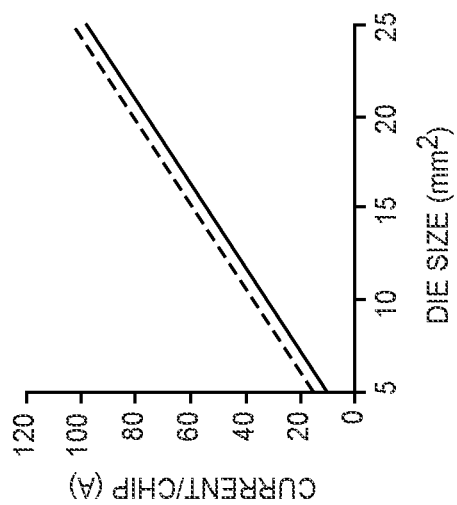

FIG. 20A is a graph illustrating the improvements in current carrying capacity to the transistor semiconductor die 210 due to the movement of the gate metal layer 218 over the source metal layer 222. A solid line illustrates a relationship between the current carrying capacity and the size of the transistor semiconductor die 210 without the improvements to the layout of the contact pads as shown in FIG. 18. A dashed line illustrates the same relationship between current carrying capacity of the transistor semiconductor die 210 with the improvements discussed above with respect to FIG. 19. The graph assumes a constant rated blocking voltage (e.g., 1200 V). As shown, an improvement in current carrying capacity of the transistor semiconductor die 210 is realized regardless of die size. As discussed above, this is due to an increase in the active area of the device region 226.

FIG. 20B is a graph further illustrating the improvements in current carrying capacity to the transistor semiconductor die 210 due to the movement of the gate metal layer 218 over the source metal layer 222. The graph illustrates a relationship between the percent increase in current carrying capacity (compared to a transistor semiconductor die without the improvements such as the one illustrated in FIG. 18) and a current rating of the transistor semiconductor die 210. As illustrated, the percentage the current capacity of the transistor semiconductor die 210 is increased has an inverse relationship with the current rating of the transistor semiconductor die 210. This is because as the current rating of the transistor semiconductor die 210 increases, so does the overall size thereof. Accordingly, the active area reclaimed as a result of the movement of the gate metal layer 218 over the source metal layer 222 makes up a smaller percentage of the total active area of the device, thereby diminishing the percentage increase in current carrying capacity seen by the use of these improvements. FIG. 20B illustrates that the largest improvements in device performance due to the improvements discussed herein are seen at lower current ratings.

FIG. 20C is a graph further illustrating the improvements in current carrying capacity to the transistor semiconductor die 210 due to the movement of the gate metal layer 218 over the source metal layer 222. The graph illustrates a relationship between the percent increase in current carrying capacity (compared to a transistor semiconductor die without the improvements such as the one illustrated in FIG. 18) and a voltage rating of the transistor semiconductor die 210. As illustrated, the percentage the current capacity of the transistor semiconductor die 210 is increased as a positive relationship with the voltage rating of the transistor semiconductor die 210. The graph shown assumes a constant size of the transistor semiconductor die 210. The relationship between the percentage increase in current carrying capacity and voltage rating is due to the fact that as the voltage rating of the transistor semiconductor die 210 increases, so does the size of the edge termination region 228. Accordingly, the size of the device region 226 decreases such that the active area reclaimed as a result of the movement of the gate metal layer 218 over the source metal layer 222 makes up a larger percentage of the total active area of the device, thereby increasing the percentage increase in current carrying capacity seen by the use of these improvements. FIG. 20C illustrates that the largest improvements in device performance for a given chip size are seen at higher voltage ratings.

Figure 21:
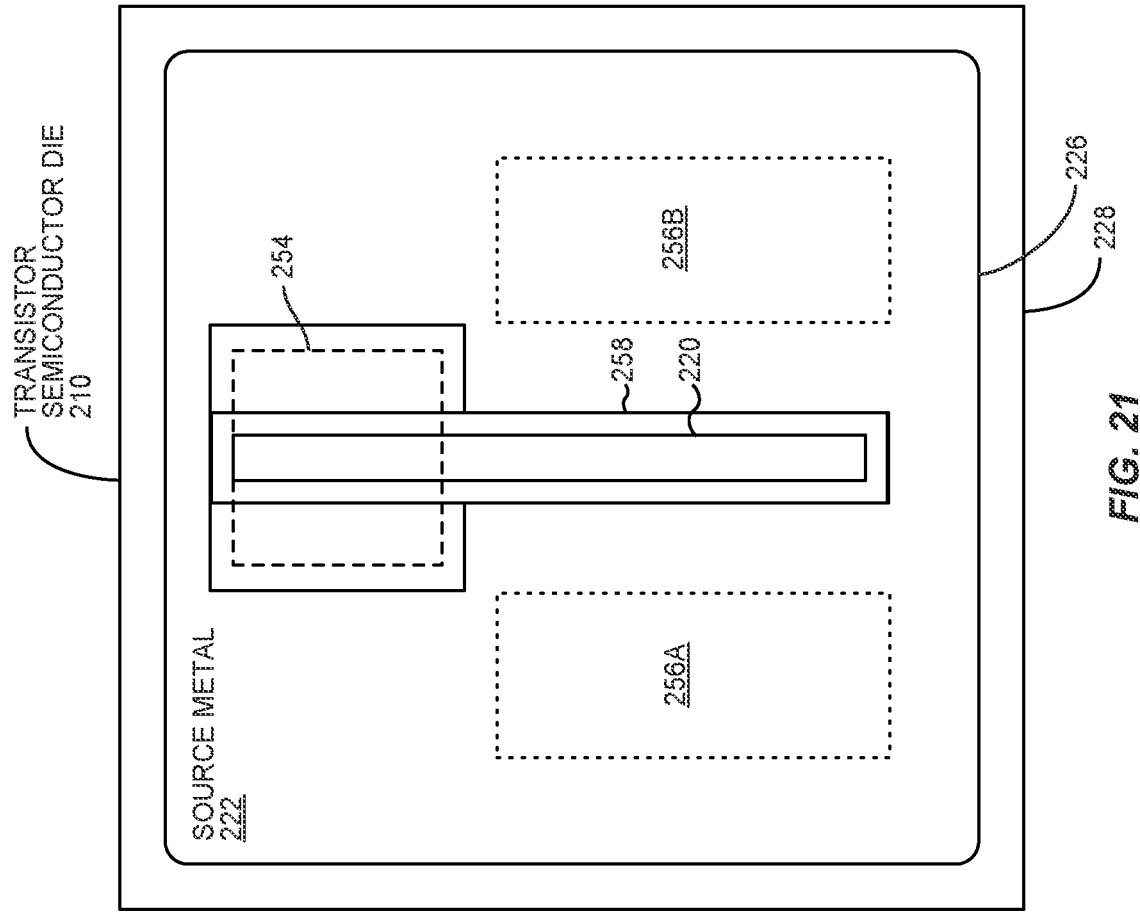
FIG. 21 is a top down view of a transistor semiconductor die according to one embodiment of the present disclosure.

FIG. 21 shows a top-down view of the transistor semiconductor die 210 according to one embodiment of the present disclosure. Specifically, FIG. 21 shows the transistor semiconductor die 210 with the gate metal layer 218 and the additional dielectric layer 250 removed. Underneath the additional dielectric layer 250 the source metal layer 222 is exposed. The gate via bar 220 is still present in the embodiment shown in FIG. 21. A first dashed box 254 illustrates the area over which the gate metal layer 218 is provided. This area may correspond with the bounds of the gate contact pad 214, or may extend beyond the bounds of the gate contact pad 214. In other words, the entirety of the gate metal layer 218 may be exposed through the passivation layer 212 as the gate contact pad 214, or part of the gate metal layer 218 may be covered by the passivation layer 212 such that only a part of the gate metal layer 218 makes up the gate contact pad 214. As shown, part of the gate metal layer 218 overlays the gate via bar 220 thus allowing the gate contact pad 214 to contact the gate electrodes 240, which are coupled to the gate via bar 220. A second dashed box 256A and a third dashed box 256B illustrate the area of the source contact pads 216. The gate via bar 220 is still located on a surface of the drift layer 236, and thus the source metal layer 222 is still required to have an opening 258 sized to accommodate the gate via bar 220. However, the overall size of the gate via bar 220 is much smaller than that of a conventional gate contact pad. Accordingly, the size of the active area within the device region 226 of the transistor semiconductor die 210 can be significantly increased.

Figure 22:
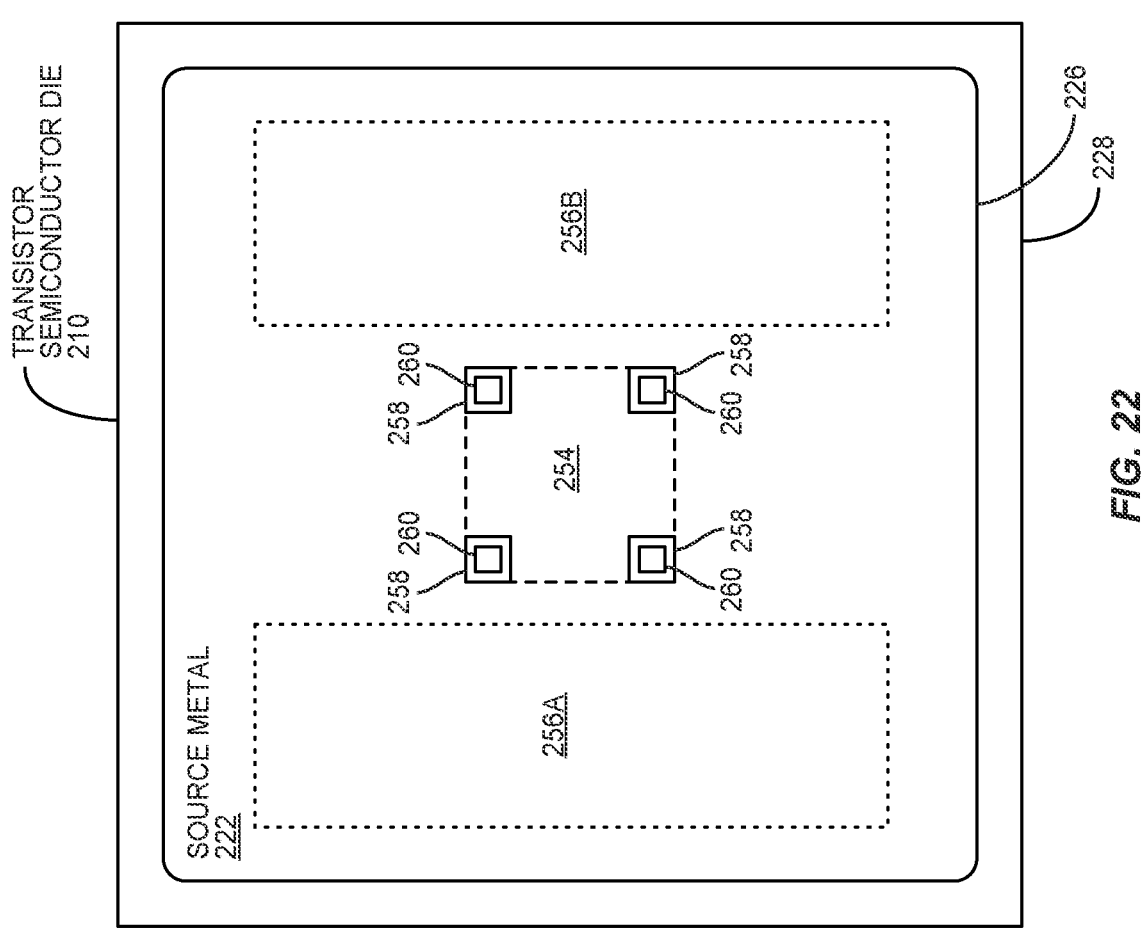
FIG. 22 is a top down view of a transistor semiconductor die according to one embodiment of the present disclosure.

FIG. 22 shows a top-down view of the transistor semiconductor die 210 according to an additional embodiment of the present disclosure. Specifically, FIG. 22 shows the transistor semiconductor die 210 with the gate metal layer 218 and the additional dielectric layer 250 removed. Underneath the additional dielectric layer 250 the source metal layer 222 is exposed. The gate via bar 220 is removed in the embodiment shown in FIG. 22 and replaced with a number of gate contact vias 260, which extend through the dielectric layer 246 and the additional dielectric layer 250 to contact one or more underlying gate electrodes 240, which are in turn coupled to one another on the surface of the drift layer 236 (e.g., in a grid configuration as shown above). The first dashed box 254 illustrates the area over which the gate metal layer 218 is provided. As shown, part of the gate metal layer 218 overlays the gate contact vias 260 thus connecting the gate contact pad 214 to the gate electrodes 240. The second dashed box 256A and the third dashed box 256B illustrate the area of the source contact pads 216. The gate contact vias 260 may have an even smaller area than the gate via bar 220. Accordingly, a total size of the openings 258 in the source metal layer 222 to accommodate connections from the gate contact pad 214 to the gate electrodes 240 may be made even smaller, thereby further increasing the active area within the device region 226 of the transistor semiconductor die 210.

Figure 23:
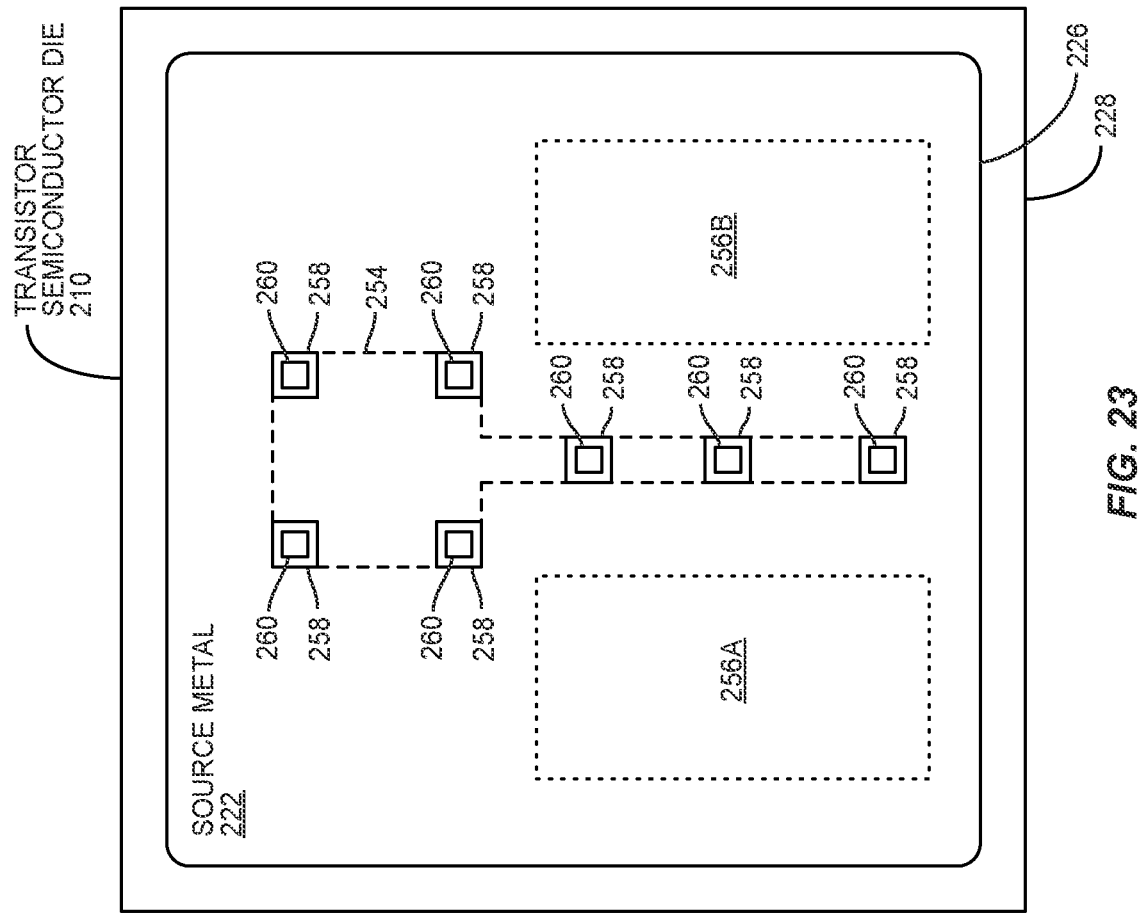
FIG. 23 is a top down view of a transistor semiconductor die according to one embodiment of the present disclosure.
Figure 24:
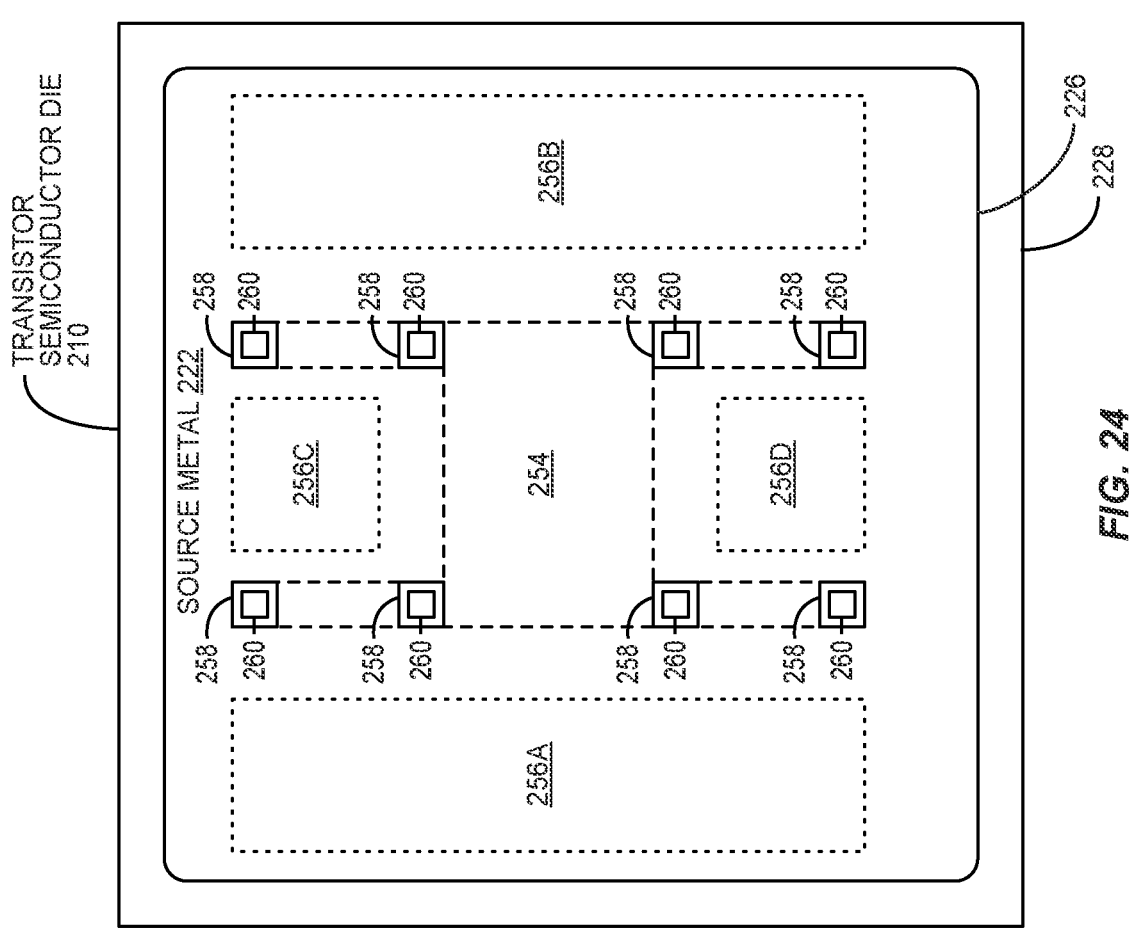
FIG. 24 is a top down view of a transistor semiconductor die according to one embodiment of the present disclosure.

As the size of the connection between the gate contact pad 214 and the underlying gate electrodes 240 decreases, a gate resistance of the transistor semiconductor die 210 may increase. Accordingly, the size and shape of the gate contact pad 214, the gate metal layer 218, and the number and placement of the gate contact vias 260 may be arranged to minimize a gate resistance of the transistor semiconductor die 210 while simultaneously maximizing an active portion of the device region 226 as illustrated in FIG. 23 and FIG. 24. In FIG. 23 and FIG. 24, the first dashed box 254 represents the placement of the gate metal layer 218 over the gate contact vias 260. The gate contact pad 214 may correspond with all or a subset of the gate metal layer 218 as discussed above. The second dashed box 256A and the third dashed box 256B once again represent the area of the source contact pads 216. In FIG. 23, a fourth dashed box 256C and a fifth dashed box 256D represent additional area of the source contact pads 216 that may be provided.

Figure 25:
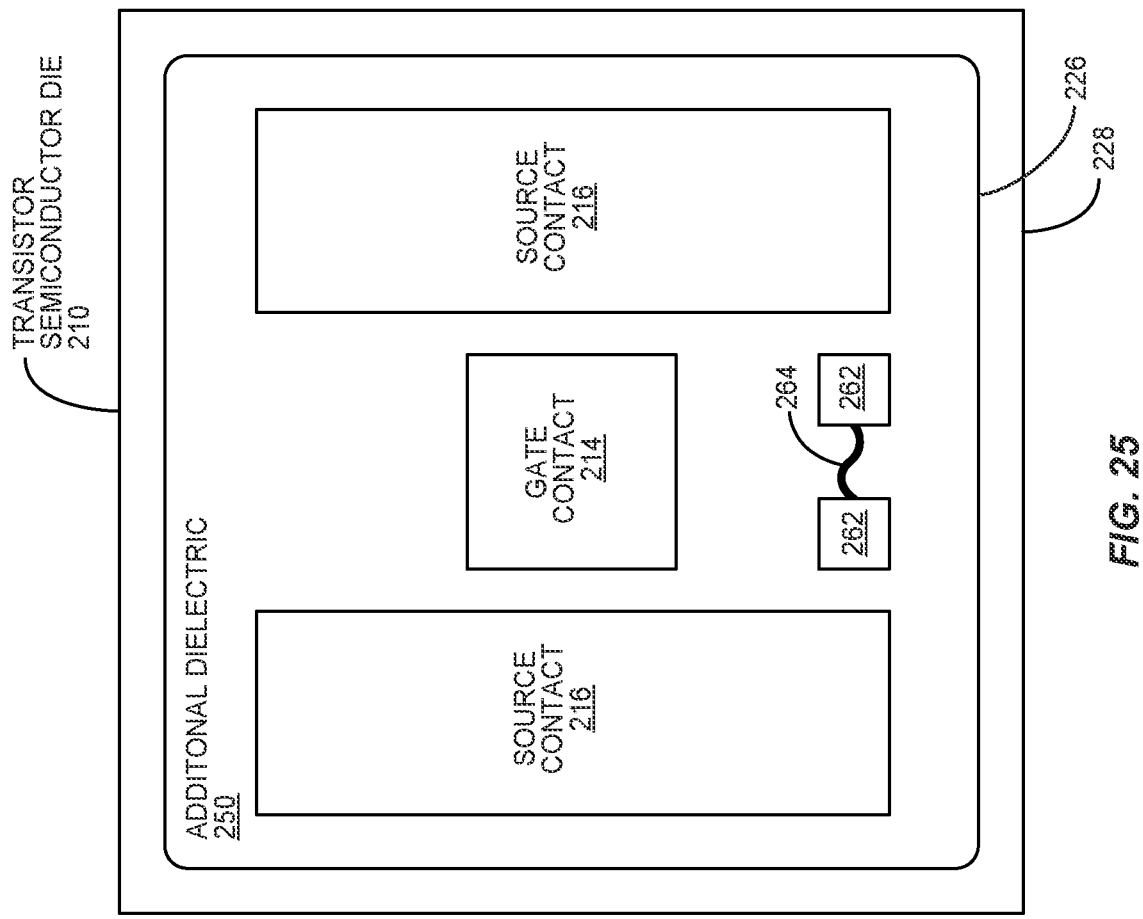

In addition to maximizing the active portion of the device region 226 of the transistor semiconductor die 210, the additional dielectric layer 250 may also be used to provide additional features. Accordingly, FIG. 25 shows a top-down view of the transistor semiconductor die 210 according to one embodiment of the present disclosure. Specifically, FIG. 25 shows the transistor semiconductor die 210 with the passivation layer 212 removed. Underneath the passivation layer 212 is the additional dielectric layer 250 through which the gate contact pad 214 and the source contact pads 216 are exposed. In addition to these contact pads, a number of sensor contact pads 262 are provided on the additional dielectric layer 250. The sensor contact pads 262 are coupled to a sensor 264, such as the embedded sensor element 22 discussed above. The sensor 264 which may be any type of sensor (e.g., a temperature sensor, a strain sensor, or a current sensor). The sensor 264 may also be located on a surface of the additional dielectric layer 250 or may be located further down the layer stack such as on the dielectric layer 246, on the drift layer 236, or even in the drift layer 236. If the sensor 264 is located in the drift layer 236, it may detract from the total active area of the device region 226. However, the sensor 264 will generally be very small compared to the size of the device region 226 and thus having a sensor in the drift layer 236 may result in only a small reduction in the active area of the device region 226. Generally, the sensor contact pads 262 will be much larger than the sensor 264 itself, and since the sensor contact pads 262 are able to be located above the source metal layer 222, the active area of the device region 226 will be minimally impacted by the introduction of one or more sensors into the transistor semiconductor die 210. The sensor contact pads 262 may be formed by the same metallization layer as the gate metal layer 218 (i.e., in the same metallization step) in some embodiments.

Figure 26:
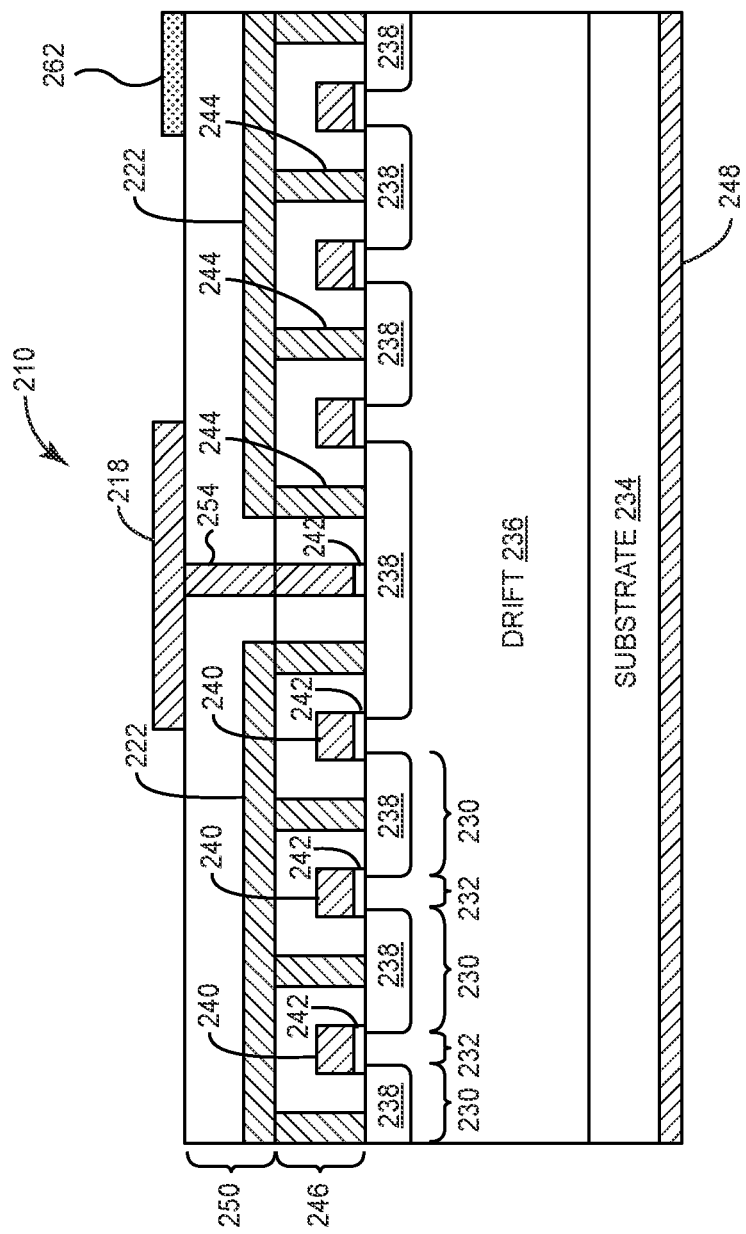
FIG. 26 is a cross-sectional view of a transistor semiconductor die according to one embodiment of the present disclosure.

FIG. 26 shows a cross-sectional view of the transistor semiconductor die 210 according to one embodiment of the present disclosure. The transistor semiconductor die 210 shown in FIG. 26 is substantially similar to that shown in FIG. 19, except that the sensor contact pad 262 is shown on the surface of the additional dielectric layer 250. The sensor 264 is not shown in FIG. 26, as the sensor 264 may be located behind the sensor contact pad 262 on the additional dielectric layer 250.

Figure 27:
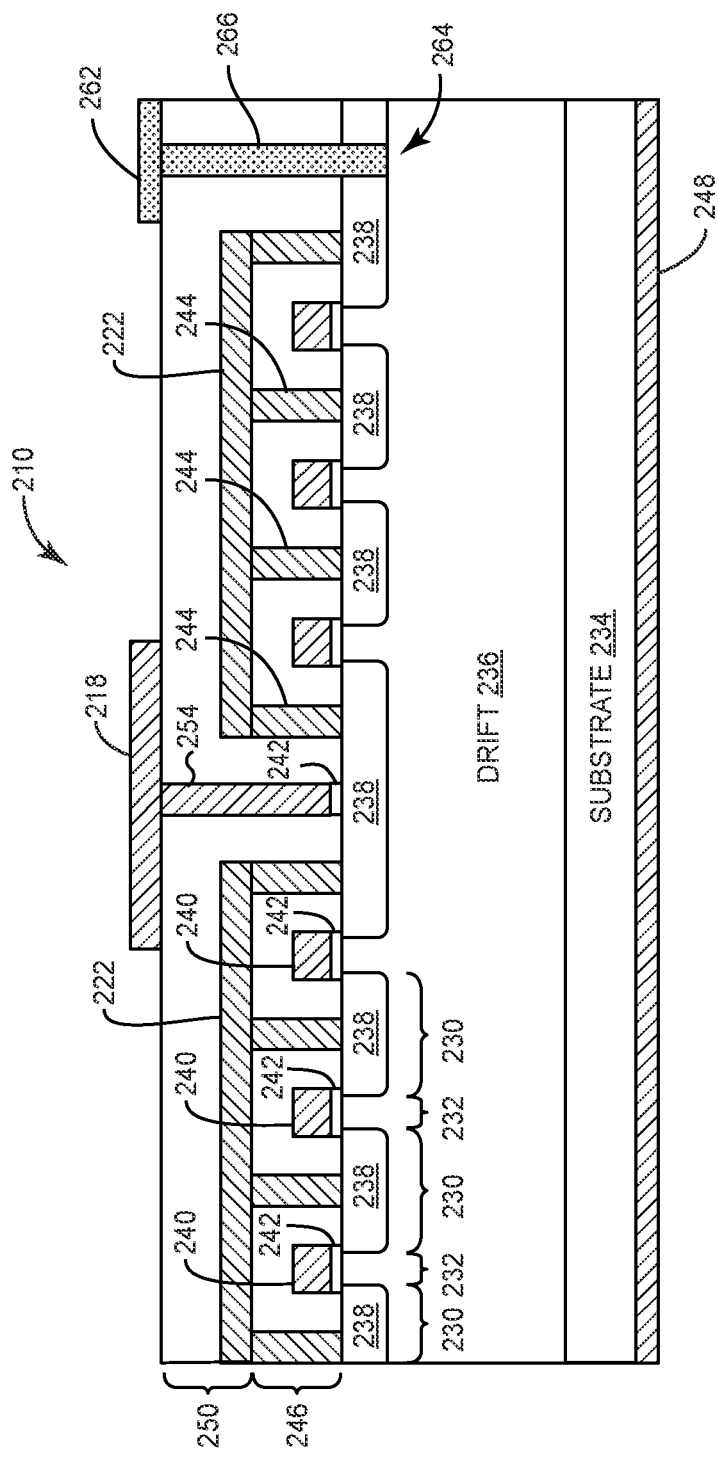
FIG. 27 is a cross-sectional view of a transistor semiconductor die according to one embodiment of the present disclosure.

FIG. 27 shows a cross-sectional view of the transistor semiconductor die 210 according to an additional embodiment of the present disclosure. The transistor semiconductor die 210 shown in FIG. 27 is substantially similar to that shown in FIG. 26, except that the sensor contact pad 262 is coupled to a sensor 264 located in the drift layer 236 by a sensor contact via 266. The sensor 264 may comprise one or more implanted regions in the drift layer 236 such that the sensor 264 can be any type of semiconductor device. The sensor 264 may be used to measure temperature, strain, current, voltage, or any other desired parameter. As discussed above, the sensor contact pad 262 generally requires a larger amount of area to implement than the sensor 264 and the sensor contact via 266. Providing the sensor contact pad 262 on the additional dielectric layer 250 such that the sensor contact pad 262 at least partially overlaps the source metal layer 222 thus reduces the impact of providing the sensor 264 in the transistor semiconductor die 210 on the active area of the device region 226 thereof. While the sensor 264 is shown in the drift layer 236, the sensor 264 may be located anywhere above or below the drift layer 236 and coupled to using any number of vias and intervening metal layers without departing from the principles of the present disclosure.

Figure 28:
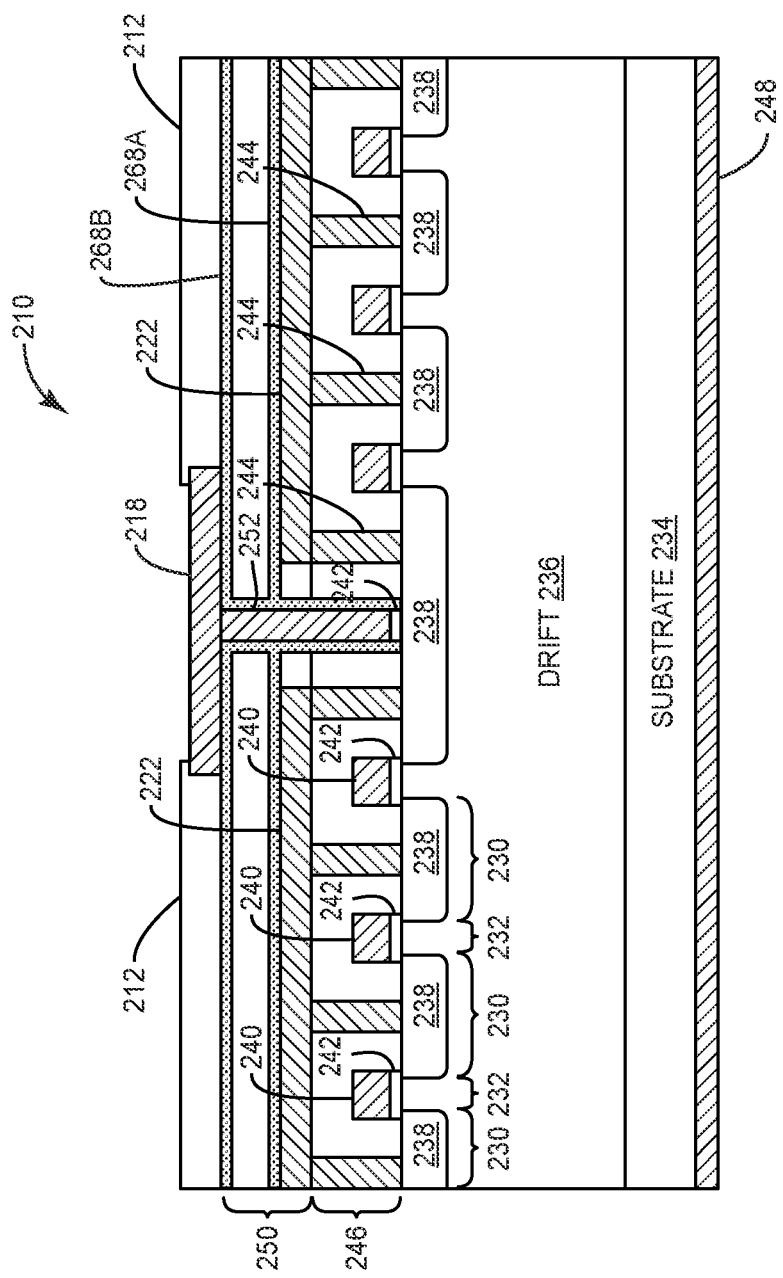
FIG. 28 is a cross-sectional view of a transistor semiconductor die according to one embodiment of the present disclosure.

FIG. 28 shows a cross-sectional view of the transistor semiconductor die 210 according to an additional embodiment of the present disclosure. The transistor semiconductor die 210 is substantially similar to that shown in FIG. 19 except that it further includes a first intervening layer 268A between the dielectric layer 246 and the additional dielectric layer 250 and a second intervening layer 268B between the additional dielectric layer 250 and the gate metal layer 218. The first intervening layer 268A and the second intervening layer 268B may reduce chemical interactions between the dielectric layer 246, the additional dielectric layer 250, the gate metal layer 218, and the source metal layer 222. This is important because the additional dielectric layer 250 may require a densification anneal for good dielectric properties. The first intervening layer 268A and the second intervening layer 268B may comprise $Si_3N_4$, $Al_2O_3$, AlN, $SiO_2$, varying layers of the same, or any other suitable materials. As discussed above, the dielectric layer 246 and the additional dielectric layer 250 may comprise $SiO_2$ or any other suitable materials. As shown, the second intervening layer 268B may be provided after an opening for the one or more vias 252 has been made. Accordingly, the second intervening layer 268B may be provided along the edges of the one or more vias 252 such that the second intervening layer 268B reduces chemical interactions between the metal of the one or more vias 252, the dielectric layer 246, and the additional dielectric layer 250. The one or more vias 252 may comprise a single conducting metal that is the same or different as the gate metal layer 218, or may comprise a stack of different metals as needed for forming a chemical or diffusion barrier layer along the walls of the one or more vias 252.

FIG. 28 also shows the passivation layer 212 over the gate metal layer 218. The passivation layer 212 may protect the transistor semiconductor die 210 from the surrounding environment. The passivation layer 212 may comprise $Si_2N_4$, $Al_2O_3$, $SiO_2$, alternating layers of the same, or any other suitable materials.

The transistor semiconductor die 210 may be a power semiconductor die configured to conduct at least 0.5 A in a forward conduction mode of operation and block at least 100 V in a blocking mode of operation. In various embodiments, the transistor semiconductor die 210 may be configured to conduct at least 1.0 A, at least 2.0 A, at least 3.0 A, at least 4.0 A, at least 5.0 A, at least 6.0 A, at least 7.0 A, at least 8.0 A, at least 9.0 A, and at least 10.0 A in the forward conduction mode of operation. The transistor semiconductor die 210 may be configured to block at least 250 V, at least 500 V, at least 750 V, at least 1 kV, at least 1.5 kV, and at least 2.0 kV in the blocking mode of operation. The same parameters apply to the semiconductor die 10 discussed above.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:
1. A semiconductor device comprising:
a drift layer comprising a wide bandgap semiconductor material;
an embedded sensor element;
an insulating layer between the drift layer and the embedded sensor element;
a shielding well between the drift layer and the embedded sensor element;
a first contact in electrical contact with the shielding well; and
a second contact in electrical contact with the shielding well, wherein the embedded sensor element is between the first contact and the second contact.
2. The semiconductor device of claim 1 wherein the embedded sensor element is a temperature sensing element.
3. The semiconductor device of claim 2 wherein the shielding well has a doping type that is opposite a doping type of the drift layer.
4. The semiconductor device of claim 3 wherein the shielding well is an implanted region in the drift layer.
5. The semiconductor device of claim 3 wherein:
the semiconductor device comprises an active area; and the active area comprises one or more implanted regions configured to provide a vertical metal-oxide-semiconductor field-effect transistor (MOSFET).

6. The semiconductor device of claim 5 wherein the wide bandgap semiconductor material comprises silicon carbide.

7. The semiconductor device of claim 3 wherein:
the semiconductor device comprises an active area; and
the active area comprises one or more implanted regions configured to provide one of a bipolar junction transistor (BJT), an insulated gate bipolar transistor (IGBT), and a thyristor.

8. The semiconductor device of claim 2 further comprising:
a first contact well, wherein:
the first contact well is an implanted region in the shielding well;
the first contact well has a same doping type as the shielding well and a doping concentration that is greater than a doping concentration of the shielding well; and
the first contact is in electrical contact with the shielding well via the first contact well; and
a second contact well, wherein:
the second contact well is an implanted region in the shielding well;
the second contact well has a same doping type as the shielding well and a doping concentration that is greater than the doping concentration of the shielding well; and
the second contact is in electrical contact with the shielding well via the second contact well.

9. The semiconductor device of claim 8 further comprising:
an inter-metal dielectric layer;
a sensor contact pad on the inter-metal dielectric layer such that the sensor contact pad at least partially overlaps one of the first contact and the second contact, wherein the sensor contact pad is electrically isolated from the first contact and the second contact by a portion of the inter-metal dielectric layer; and
a via through the inter-metal dielectric such that the via electrically couples the sensor contact pad to the embedded sensor element.

10. The semiconductor device of claim 2 wherein the first contact and the second contact are electrically coupled to a fixed potential.

11. The semiconductor device of claim 2 wherein a distance between the first contact and the second contact is less than or equal to 200 μm.

12. The semiconductor device of claim 2 further comprising a noise reduction well, wherein:
the noise reduction well has a doping type that is opposite the doping type of the shielding well;
the noise reduction well is separated from the drift layer by at least a portion of the noise reduction well; and
the first contact and the second contact are in electrical contact with the noise reduction well.

13. The semiconductor device of claim 1 wherein the embedded sensor element is a diode.

14. A semiconductor device comprising:
a drift layer comprising a wide bandgap semiconductor material;
an embedded sensor element;
an insulating layer between the drift layer and the embedded sensor element;
a shielding well between the drift layer and the embedded sensor element; and an additional functional layer and an additional insulating layer between the drift layer and the embedded sensor element,
wherein the insulating layer is on the drift layer, the additional functional layer is on the insulating layer, the additional insulating layer is on the additional functional layer, and the embedded sensor element is on the additional insulating layer.

15. The semiconductor device of claim 14 wherein the additional functional layer comprises polysilicon.

16. The semiconductor device of claim 14 wherein the additional functional layer comprises polysilicon that is one of at least partially metallized and at least partially silicided.

17. The semiconductor device of claim 14 further comprising a lumped resistor element on the additional insulating layer.

18. The semiconductor device of claim 17 wherein:
the semiconductor device comprises an active area; and
the active area comprises one or more implanted regions configured to provide a metal-oxide-semiconductor field-effect transistor (MOSFET); and
the lumped resistor element is coupled to a gate of the MOSFET.

19. The semiconductor device of claim 14 further comprising:
a noise reduction well;
a first contact in electrical contact with the shielding well; and
a second contact in electrical contact with the shielding well, wherein the embedded sensor element is between the first contact and the second contact,
wherein the noise reduction well has a doping type that is opposite the doping type of the shielding well,
wherein the noise reduction well is separated from the drift layer by at least a portion of the noise reduction well, and
wherein the first contact and the second contact are in electrical contact with the noise reduction well.

20. The semiconductor device of claim 14 wherein the embedded sensor element is a temperature sensing element.

21. A semiconductor device comprising:
a substrate;
a drift layer on the substrate;
an insulating layer on the drift layer;
a first functional layer on the insulating layer;
an additional insulating layer on the first functional layer; and
a lumped resistor element on the additional insulating layer.

22. The semiconductor device of claim 21 wherein the first functional layer comprises polysilicon.

23. The semiconductor device of claim 22 wherein the first functional layer comprises polysilicon that has been one of partially metallized and partially silicided.

24. The semiconductor device of claim 23 wherein the semiconductor device comprises an active area including one or more implanted regions in the drift layer, wherein the one or more implanted regions are configured to provide a metal-oxide-semiconductor field-effect transistor (MOSFET) and the lumped resistor element is coupled to a gate of the MOSFET.

25. The semiconductor device of claim 24 wherein the first functional layer provides a gate electrode of the MOSFET.

* * * * *